United States Patent
Shoji

(10) Patent No.: US 7,969,149 B2
(45) Date of Patent: Jun. 28, 2011

(54) MAGNETIC SENSOR, MAGNETIC DIRECTION SENSOR, METHOD OF DETECTING MAGNETIC FIELD AND METHOD OF DETECTING MAGNETIC DIRECTION

(75) Inventor: Shigeru Shoji, Tokyo (JP)

(73) Assignee: TDK Corporation, Tokyo (JP)

( * ) Notice: Subject to any disclaimer, the term of this patent is extended or adjusted under 35 U.S.C. 154(b) by 762 days.

(21) Appl. No.: 12/071,700

(22) Filed: Feb. 25, 2008

(65) Prior Publication Data
US 2008/0204011 A1 Aug. 28, 2008

(30) Foreign Application Priority Data

Feb. 27, 2007 (JP) ................. 2007-047777

(51) Int. Cl.
*G01R 33/09* (2006.01)

(52) U.S. Cl. ........................................ 324/252

(58) Field of Classification Search .............. 324/252
See application file for complete search history.

(56) References Cited

U.S. PATENT DOCUMENTS

| 5,287,238 | A | * | 2/1994 | Baumgart et al. | ............ 360/314 |
| 6,124,711 | A | * | 9/2000 | Tanaka et al. | ................. 324/252 |
| 6,920,684 | B2 | | 7/2005 | Shonai et al. | |
| 2006/0071660 | A1 | * | 4/2006 | Yamada | ........................ 324/252 |

FOREIGN PATENT DOCUMENTS

| JP | A 6-174471 | 6/1994 |
| JP | B2 3318762 | 8/2002 |
| JP | A 2003-66127 | 3/2003 |

* cited by examiner

*Primary Examiner* — Jay M Patidar
(74) *Attorney, Agent, or Firm* — Oliff & Berridge, PLC

(57) ABSTRACT

A magnetic direction sensor can detect at higher precision the magnitude and direction of a detected magnetic field. The magnetic direction sensor has a measuring section, a storage section and an operating section. The measuring section has first and second MR elements, and detects resistance values of these elements in accordance with an attitude change of the sensor and the presence or absence of a bias magnetic field to be applied through a coil in a direction orthogonal to a magnetization direction of each pinned layer in the first and second MR elements. The storage section stores fixed data invariable in response to a detected magnetic field direction, in resistance values of these elements measured by the measuring section. The operating section calculates a detected magnetic field vector from variable data of resistance values of these elements measured by the measuring section, and fixed data stored in the storage section.

14 Claims, 17 Drawing Sheets

MAGNETIC SENSOR, MAGNETIC DIRECTION SENSOR, METHOD OF DETECTING MAGNETIC FIELD AND METHOD OF DETECTING MAGNETIC DIRECTION

BACKGROUND OF THE INVENTION

1. Field of the Invention

The present invention relates to a magnetic sensor capable of detecting a change in a magnetic field with high sensitivity, and a method of manufacturing the magnetic sensor.

2. Description of the Related Art

As a magnetic sensor for detecting the direction of a micro magnetic field such as geomagnetism, there has been known one using an anisotropic magnetoresistive element formed of a ferromagnetic material such as permalloy (for example, refer to Japanese Patent No. 3318762 and Japanese Unexamined Patent Application Publication No. Hei 6-174471).

Recently, there has been developed a magnetic sensor provided with a plurality of giant magnetoresistive elements (GMR) exhibiting higher detective sensitivity to a change in a magnetic field than the anisotropic magnetoresistive effect element (for example, refer to Japanese Unexamined Patent Application Publication No. 2003-66127). In this type of the magnetic sensor, a bridge circuit is configured by, for example, four GMR elements, and when a micro magnetic field to be detected (hereinafter referred to as a "detected magnetic field"), the resistances of certain two GMR elements are changed in the positive direction and the resistances of the remaining two GMR elements are changed in the negative direction. The magnitude of the detected magnetic field can be measured by detecting a difference in the resistance change of each GMR element (a differential output).

SUMMARY OF THE INVENTION

All of the four GMR elements configuring the bridge circuit as described in Japanese Unexamined Patent Application Publication No. 2003-66127 are required to exhibit the same resistance in the condition where no detected magnetic field is applied (i.e. the measurement wait condition). Even if one of the four GMR elements exhibits a different resistance, a differential output (an offset voltage) of the bridge circuit may be generated even in the measurement wait condition. The resistance in each GMR element can be determined mainly by the angle formed between the magnetization direction of a free layer and the magnetization direction of a pinned layer. The magnetization direction of the free layer can also be influenced by the direction and magnitude of the anisotropic magnetic field, and the magnitude and direction of an exchange bias magnetic field to be generated between the pinned layer and the free layer. Therefore, in order to equalize the resistances in all of the magnetoresistive effect elements, it is necessary to bring the anisotropic magnetic field direction and the magnetization direction of the pinned layer into coincidence with each other.

In fact, there are relatively large variations (manufacturing errors) in the angle formed between the anisotropic magnetic field direction and the magnetization direction of the pinned layer. Therefore, it is extremely difficult to completely eliminate the generation of the abovementioned offset voltage. However, the offset voltage becomes a large error factor when measuring, for example, a magnetic field of an extremely micro magnetic field such as geomagnetism (for example, 10 Oe (=2500/π) A/m) or below. Hence, there is a need for a method of measuring a detected magnetic field by which the offset voltage due to manufacturing errors can be reduced to achieve higher precision.

It is desirable to provide a magnetic sensor and a magnetic direction sensor which are capable of detecting the magnitude and the magnetic direction of a detected magnetic field with higher precision, respectively, as well as a method of detecting a magnetic field and a method of detecting a magnetic direction using them, respectively.

A magnetic sensor of an embodiment of the invention includes a measuring section, a storage section and an operating section. The measuring section has a magnetoresistive element in which a pinned layer having a magnetization pinned in a certain direction and a free layer changing its magnetization direction depending on an external magnetic field are stacked with a non-magnetic intermediate layer in between, and a magnetic field applying means for applying, to the magnetoresistive element, a bias magnetic field in a direction forming a certain relative angle against the magnetization direction of the pinned layer. The measuring section detects resistance values of the magnetoresistive element in accordance with a change of attitude direction of the magnetic sensor and the presence or absence of the bias magnetic field. The storage section stores fixed data which is invariable irrespective of the attitude direction of the magnetic sensor, the fixed data configuring a part of the resistance values measured by the measuring section. The operating section calculates a predetermined direction component of a magnetic field to be detected by using both of variable data which varies in accordance with the attitude direction of the magnetic sensor, and the fixed data stored in the storage section, the variable data configuring another part of the resistance values measured by the measuring section. As used herein, the certain relative angle means an arbitrary certain angle, except for 0° and 180°. The fixed data are stable and inherent resistance value data to be determined by the structure of the entire magnetic sensor including magnetoresistive element and the magnetic field applying means. The variable data are resistance value data whose variations can be observed serially n response to the change in the detected magnetic field direction.

In the magnetic sensor of the invention, the fixed data detected in advance are stored in the storage section. By using the fixed data and the variable data variable in response to the detected magnetic field direction, a predetermined direction component of the detected magnetic field can be obtained in the operating section relatively easily and at high precision, without the need for making corrections every time a measurement is made.

A magnetic direction sensor of the invention includes a measuring section, a storage section and an operating section. The measuring section has first and second magnetoresistive elements and a magnetic field applying means. Each of the first and second magnetoresistive elements has a stacked structure in which a pinned layer having a magnetization pinned in a certain direction and a free layer changing its magnetization direction depending on an external magnetic field, are stacked with a non-magnetic intermediate layer in between. The first and second magnetoresistive elements are arranged to have different directions in which a resistance value becomes an extreme. The magnetic field applying means applies, to the first and second magnetoresistive elements, first and second bias magnetic fields, respectively, the first bias magnetic field having a direction forming a certain relative angle against the magnetization direction of the pinned layer of the first magnetoresistive element, the second bias magnetic field having a direction forming a certain relative angle against the magnetization direction of the pinned layer of the second magnetoresistive element, and the measuring section detects resistance values of the first and second magnetoresistive elements in accordance with a change of attitude direction of the magnetic sensor and the presence or absence of the first and second bias magnetic fields. The storage section stores fixed data which is invariable irrespective of the attitude direction of the magnetic sensor, the fixed data configuring a part of the resistance values measured by the measuring section. The operating section calculates a magnetic field vector of a magnetic field to be detected by using variable data which varies in accordance with the attitude direction of the magnetic sensor, and the fixed data stored in the storage section, the variable data configuring another part of the resistance values measured by the measuring section.

In the magnetic direction sensor of the invention, there are the storage section for storing the fixed data detected in advance, and the operating section for operating a detected magnetic field component by using the fixed data and the variable data variable in response to the detected magnetic field direction. The presence of these sections eliminates the need for performing correction every time the predetermined direction component of the detected magnetic field having an arbitrary direction is calculated.

A method of detecting a magnetic field according to the invention uses a magnetic sensor including a magnetoresistive element in which a pinned layer having a magnetization pinned in a certain direction and a free layer changing its magnetization direction depending on an external magnetic field are stacked with a non-magnetic intermediate layer in between, and a magnetic field applying means for applying, to the magnetoresistive element, a bias magnetic field in a direction forming a certain relative angle against the magnetization direction of the pinned layer. The method includes the following first to three steps.

The first step is for setting an attitude direction of the magnetic sensor so that a direction of the bias magnetic field corresponds with a first direction, and detecting a first output signal from the magnetoresistive element with the bias magnetic field unapplied, and also detecting a second output signal from the magnetoresistive element with the bias magnetic field applied.

The second step is for setting an attitude direction of the magnetic sensor so that a direction of the bias magnetic field corresponds with a second direction different from the first direction, and detecting a third output signal from the magnetoresistive element with the bias magnetic field unapplied, and also detecting a fourth output signal from the magnetoresistive element with the bias magnetic field applied.

The third step is for calculating a component of a magnetic field to be detected, the component in a direction where a resistance value of the magnetoresistive element becomes an extreme, based on the following equation (1).

$$Hv=(V-Vs-MOV)/(1-CPV) \quad (1)$$

where Hv is a component of the magnetic field to be detected, the component in a direction where a resistance value of the magnetoresistive element becomes an extreme; V is an output signal from the magnetoresistive element with a bias magnetic field unapplied, when the magnetic sensor is directed to an attitude direction; Vs is an output signal from the magnetoresistive element with a bias magnetic field applied, when the magnetic sensor is directed to the attitude direction; MOV is a value (differential data) calculated by V1−V2; and CPV is a value (compressed data) calculated by (V4−V2)/(V3−V1). V1 to V4 are first to fourth output signals.

In the method of detecting a magnetic field of the present invention, the first to fourth output signals (V1 to V4) can be detected as described above, and MOV and CPV as the inherent characteristic values (fixed data) invariable in response to the detected magnetic field direction, can be obtained in advance by using these signals. From the relationship between these fixed data and observed values (variable data) when there exists a detected magnetic field having an arbitrary direction, a predetermined direction component of the detected magnetic field can be found uniquely.

Alternatively, by using a magnetic sensor configured so that a direction where the resistance value of a magnetoresistive element becomes an extreme is orthogonal to a bias magnetic field direction, the precision of fixed data can be further improved. Alternatively, in the first and second steps, the resistance value of the magnetoresistive element may be measured repeatedly, and based on the average value thereof, the first to fourth output signals may be determined. This also enables the precision of fixed data to be further improved.

A method of detecting a magnetic direction according to the invention uses a magnetic direction sensor provided with (i) first and second magnetoresistive elements each having a stacked structure in which a pinned layer having a magnetization pinned in a certain direction and a free layer changing its magnetization direction depending on an external magnetic field, are stacked with a non-magnetic intermediate layer in between, the first and second magnetoresistive elements being arranged to have different directions in which a resistance value becomes an extreme, and (ii) a magnetic field applying means for applying, to the first and second magnetoresistive elements, first and second bias magnetic fields, respectively, the first bias magnetic field having a direction forming a certain relative angle against the magnetization direction of the pinned layer of the first magnetoresistive element. The method includes the following first to seventh steps.

The first step is for setting an attitude direction of the magnetic direction sensor so that a direction of the first bias magnetic field corresponds with a first direction, and detecting a first output signal from the first magnetoresistive element with the first and second bias magnetic fields unapplied, and also detecting a second output signal from the first magnetoresistive element with the first bias magnetic field applied.

The second step is for setting an attitude direction of the magnetic direction sensor so that a direction of the first bias magnetic field corresponds with a second direction different from the first direction, detecting a third output signal from the first magnetoresistive element with the first and second bias magnetic fields unapplied, and also detecting a fourth output signal from the first magnetoresistive element with the first bias magnetic field applied.

The third step of setting an attitude direction of the magnetic direction sensor so that a direction of the second bias magnetic field corresponds with the first direction, and detecting a fifth output signal from the second magnetoresistive element with the first and second bias magnetic fields unapplied, and also detecting a sixth output signal from the second magnetoresistive element with the second bias magnetic field applied.

The fourth step is for setting an attitude direction of the magnetic direction sensor so that a direction of the second bias magnetic field corresponds with the second direction, and detecting a seventh output signal from the second magnetoresistive element with the first and second bias magnetic fields unapplied, and also detecting an eighth signal from the second magnetoresistive element with the second bias magnetic field applied.

The fifth step is for calculating a first component of a magnetic field to be detected, the first component in a direction where a resistance value of the first magnetoresistive element becomes an extreme, based on the following equation (2).

The sixth step is for calculating a second component of the magnetic field to be detected, the second component in a direction where a resistance value of the second magnetoresistive element becomes an extreme, based on the following equation (3).

The seventh step is for calculating a magnetic field vector of the magnetic field to be detected by using the first component and the second component.

$$Hx = (X-Xs-MOX)/(1-CPX) \quad (2)$$

$$Hy = (Y-Ys-MOY)/(1-CPY) \quad (3)$$

were Hx is a first component of the magnetic field to be detected;

Hy is a second component of the magnetic field to be detected;

X is an output signal from the first magnetoresistive element with a first bias magnetic field unapplied, when the magnetic direction sensor is directed to an attitude direction;

Xs is an output signal from the first magnetoresistive element with a first bias magnetic field applied, when the magnetic direction sensor is directed to an attitude direction;

Y is an output signal from the second magnetoresistive element with the second bias magnetic field unapplied, when the magnetic direction sensor is directed to an attitude direction;

Ys is an output signal from the second magnetoresistive element with the second bias magnetic field applied, when the magnetic direction sensor is directed to an attitude direction;

MOX is X1−X2;
CPX is (X4−X2)/(X3−X1);
X1 is a first output signal;
X2 is a second output signal;
X3 is a third output signal;
X4 is a fourth output signal;
MOY is Y1−Y2;
CPY is (Y4−Y2)/(Y3−Y1);
Y1 is a fifth output signal;
Y2 is a sixth output signal;
Y3 is a seventh output signal; and
Y4 is an eighth output signal.

In the method of detecting a magnetic direction of the invention, the first to eighth output signals (X1 to X4 and Y1 to Y4) can be detected as described above, and MOX and MOY, and CPX and CPY as the inherent characteristic values (fixed data) invariable in response to the detected magnetic field direction, can be obtained in advance by using these signals. From the relationship between these fixed data and observed values (variable data) when there exists a detected magnetic field having an arbitrary direction, the detected magnetic field direction can be found uniquely.

According to the magnetic sensor of the invention, the fixed data detected in advance by the measuring section are stored in the storage section, and the operating section can therefore obtain a predetermined direction component of a detected magnetic field relatively easily and at high precision by using fixed data and variable data variable in response to a detected magnetic field direction.

According to the magnetic direction sensor of the invention, there are provided the storage section for storing fixed data detected in advance by the measuring section, and the operating section for operating a detected magnetic field component by using the fixed data and variable data variable in response to a detected magnetic field direction. This enables an arbitrary detected magnetic field direction to be obtained at high precision, without the need for performing corrections each time.

According to the method of detecting a magnetic field, fixed data containing offset output information due to manufacturing errors and the like are detected in advance and stored in the storage section, and the fixed data are used when measuring an arbitrary detected magnetic field component. This enables simple correction of the offset output, permitting high precision detection of a detected magnetic field component in a predetermined direction.

According to the method of detecting a magnetic direction, fixed data containing offset output information due to manufacturing errors and the like are detected in advance and stored in the storage section, and the fixed data are used when measuring an arbitrary detected magnetic field direction. This enables simple correction of the offset output, permitting high precision detection of a detected magnetic field direction in a predetermined direction.

Other and further objects, features and advantages of the invention will appear more fully from the following description.

DESCRIPTION OF THE PREFERRED EMBODIMENTS

Preferred embodiments of the present invention will now be described in detail with reference to the accompanying drawings.

Figure 1:
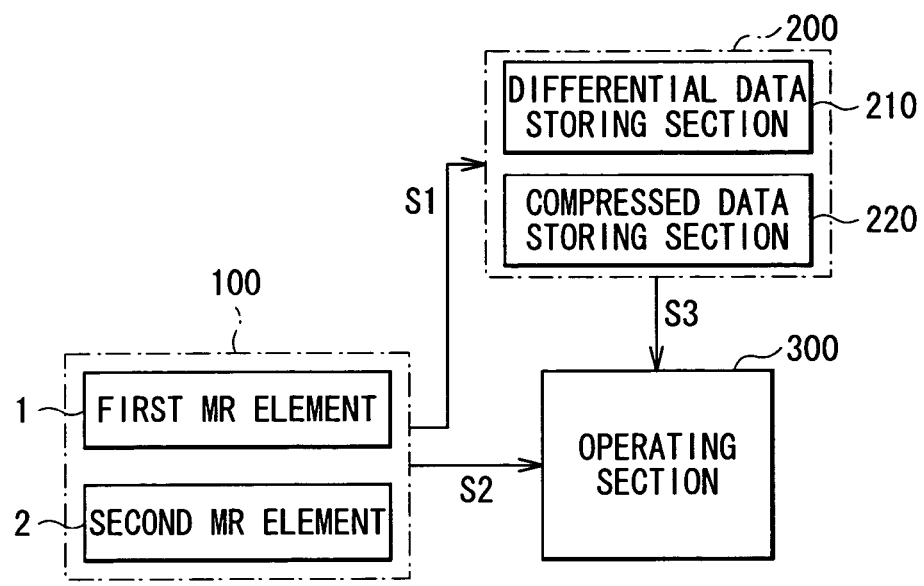
FIG. 1 is a block diagram showing the configuration of a magnetic direction sensor as a preferred embodiment in the present invention.

The configuration of a magnetic direction sensor as a preferred embodiment in the present invention will be firstly described with reference to FIG. 1 and the like. FIG. 1 is a block diagram showing the entire configuration of the magnetic direction sensor of the present embodiment. A magnetic sensor of the present invention includes the magnetic direction sensor described below.

The magnetic sensor is provided with a measuring section 100, a storage section 200 and an operating section 300. The measuring section 100 has a first magnetoresistive (MR) element 1 and a second magnetoresistive (MR) element 2, and coils 30 (30X and 30Y), which apply bias magnetic fields Hb (Hbx and Hby) to these elements, respectively. The measuring section 100 detects the resistance values of the first and second MR elements 1 and 2 in accordance with an attitude change of the magnetic sensor and the presence or absence of the bias magnetic fields Hb. The bias magnetic fields Hb and the coils 30 will be described later. In the resistance value data of the first and second MR elements 1 and 2 measured by the measuring section 100, fixed data invariable in response to the detected magnetic field direction are sent as a signal S1 to the storage section 200, and variable data variable in response to a detected magnetic field direction are sent as a signal S2 to the operating section 300. The fixed data means stable and inherent resistance value data to be determined by the structures of the first and second MR elements 1 and 2, respectively. The storage section 200 has a differential data storing section 210 for storing differential data of the fixed data, and a compressed data storing section 220 for storing compressed data of the fixed data. The differential data and the compressed data stored temporally stored in the storage section 200 are read when detecting an arbitrary detected magnetic field direction, and then sent as a signal S3 to the operating section 300. The differential data and the compressed data will be described later. The operating section 300 calculates the magnitude and the direction of a detected magnetic field Hm by using the signal S2 from the measuring section 100, and the signal S3 from the storage section 200.

Figure 2:
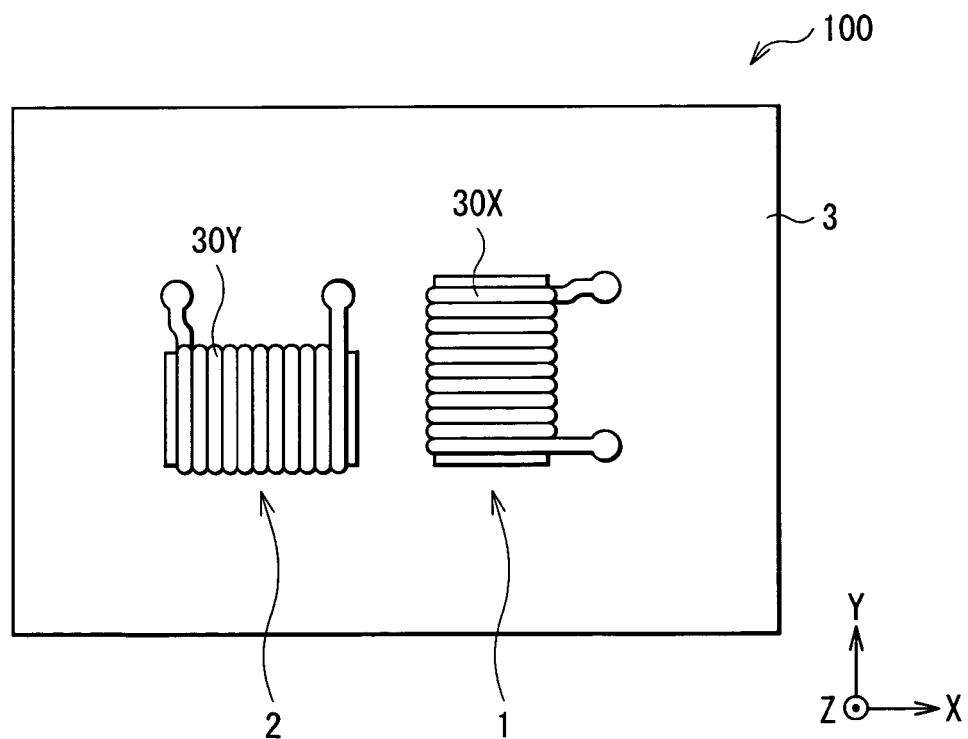
FIG. 2 is a plan view showing the configuration of a measuring section in FIG. 1.

FIG. 2 is a schematic diagram showing the planar configuration of the measuring section 100 in FIG. 1. The measuring section 100 has the first and second MR elements 1 and 2 mounted on an integrated substrate 3. The first and second MR elements 1 and 2 are arranged so that directions in which their respective resistance values become extremes (hereinafter referred to as "extreme directions") are orthogonal to each other. In this case, the extreme direction of the first MR element 1 is expressed as an X direction, and the extreme direction of the second MR element 2 is expressed as a Y direction. That is, when there exists a detected magnetic field Hm parallel to an X axis, the first MR element 1 has a maximum or minimum resistance value, and when there exists a detected magnetic field Hm parallel to a Y axis, the second MR element 2 has a maximum or minimum resistance value. The measuring section 100 is further provided with the coils 30X and 30Y, and a drive circuit 4 (not shown here) for driving the first and second MR elements 1 and 2. The coil 30X generates the bias magnetic field Hby in the Y axis direction, and the coil 30Y generates the bias magnetic field Hbx in the X axis direction. Since the first and second MR elements 1 and 2 have the same structure, the first MR element 1 will be described below, and the description of the second MR2 will be omitted.

Figure 3:
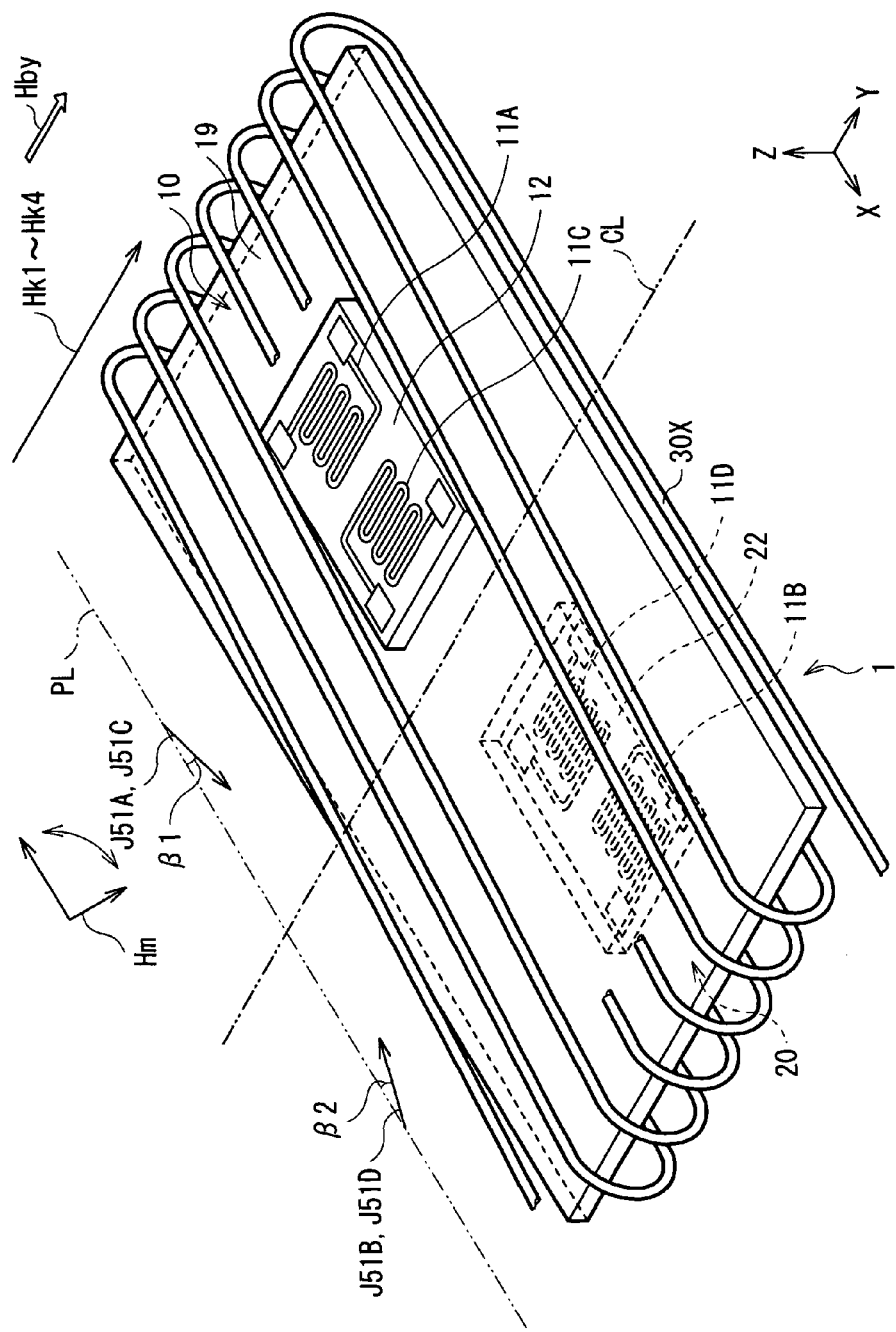
FIG. 3 is a perspective view showing in enlarged dimension a first MR element in FIG. 2.

FIG. 3 shows a perspective configuration of the first MR element 1. The first MR element 1 has a first module 10 where first and third element pattern groups 11A and 11C are mounted on an element substrate 12, and a second module 20 where second and fourth element pattern groups 11B and 11D are mounted on an element substrate 22. The first and third element pattern groups 11A and 11C have the same configuration and form an equivalent relationship, and the second and fourth element groups 11B and 11D have the same configuration and form an equivalent relationship. The element substrates 12 and 22 are, for example, AlTic ($Al_2O_3$.TiC) substrates or silicon (Si) substrates, a surface of which is insulated, more specifically on a surface of which an aluminium oxide layer is provided. The first module 10 is provided on the upper surface of a module substrate 19, and the second module 20 is provided on the lower surface of the module substrate 19. That is, the first and second modules 10 and 20 have a rotationally symmetrical relationship with each other around a central axis CL parallel to the Y axis within the module substrate 19. In other words, when the first module 10 is rotated 180° around the central axis CL, this results in a positional relationship that the first and third element pattern groups 11A and 11C are configurationally coincident with the second and fourth element patterns 11B and 11D on the second module 20, respectively. The central axis CL is parallel to axes of easy magnetization Hk1 and Hk2 to be described later. In the present embodiment, the direction along the central axis CL is a Y direction, the direction orthogonal to the Y direction in the plane of the module substrate 19 is an X direction, and the direction orthogonal to the plane of the module substrate 19 is a Z direction. The magnetic sensor is for detecting the magnitude and direction of the detected magnetic field Hm to be changed in a certain rotational plane (i.e. the XY plane).

The coil 30X is a conductor wound around the central axis CL in the periphery of the module substrate 19. When current is supplied, the coil 30X generates the bias magnetic field Hby in the directions of anisotropic magnetic fields Hk1 to Hk4 (i.e. +Y direction), and applies this to the first to fourth element pattern groups 11A to 11D. The bias magnetic field Hby has at least the magnitude of a magnetic field at which the magnifications of free layers 53A and 53B to be described later are saturated.

Figure 4A:
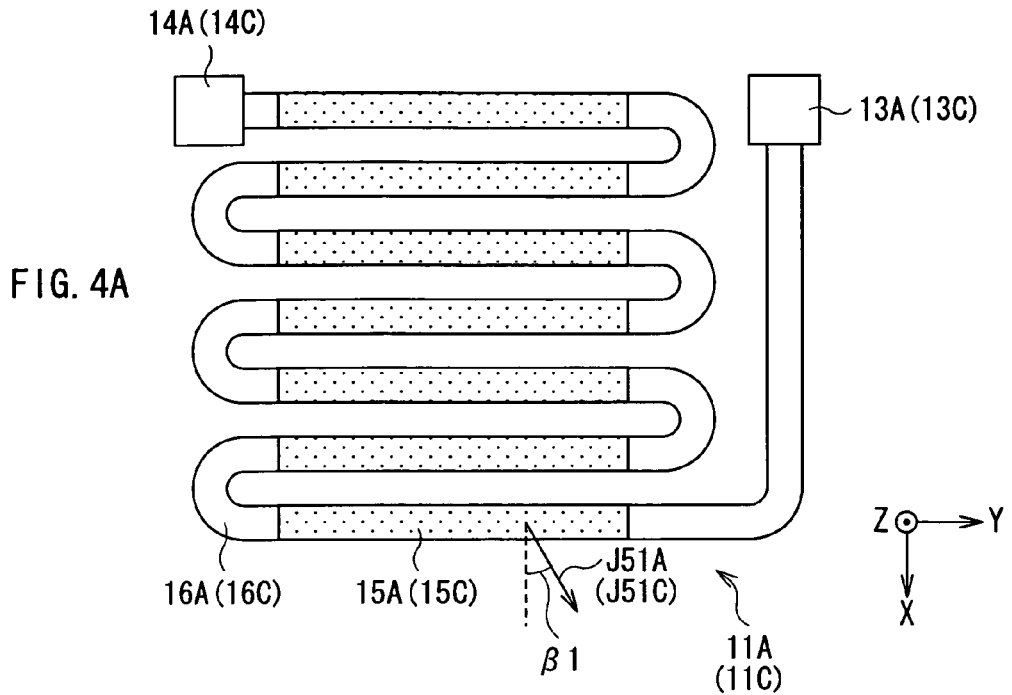
FIGS. 4A and 4B are plan views showing in enlarged dimension first to fourth element pattern groups 11A to 11D shown in FIG. 3.
Figure 4B:
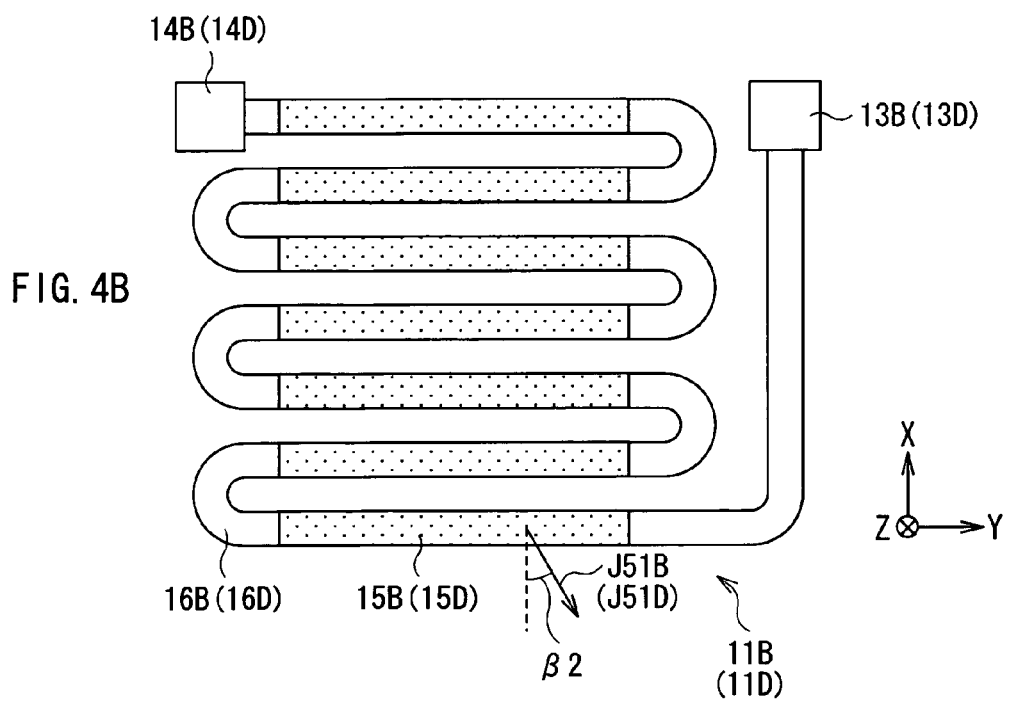

FIG. 4A is a plan view showing in enlarged dimension the first and third element pattern groups 11A and 11C shown in FIG. 3. FIG. 4B is a plan view showing in enlarged dimension the second and fourth element pattern groups 11B and 11D shown in FIG. 3. The first and third element pattern groups 11A and 11C have a plurality of element patterns 15A and 15C, respectively, as shown in FIG. 4A, where seven element patterns 15A and seven element patterns 15C are shown, between a pair of electrodes 13A and 14A and a pair of electrodes 14A and 14C each being formed of copper or the like. These element patterns 15A and 15C can be formed by using sputtering method and photolithography method, and they are in the shape of a strip extending in the Y direction, and are arranged so as to be adjacent to each other in the X direction orthogonal to the Y direction. These element patterns 15A and 15C thus arranged are connected to each other through connecting portions 16A and 16C, whose both ends in the longitudinal direction (the Y direction) are formed of a non-magnetic conductive layer of copper or the like, so that a zigzag shape can be formed between the electrodes 13A and 13C and the electrodes 14A and 14C, respectively.

The second and fourth element pattern groups 11B and 11D have a plurality of element patterns 15B and 15D, respectively, as shown in FIG. 4B, where seven element patterns 15B and seven element patterns 15D are shown, between a pair of electrodes 13B and 13D and a pair of electrodes 14B and 14D each being formed of copper or the like. These element patterns 15B and 15D can be formed by using sputtering method and photolithography method, and they are in the shape of a strip extending in the Y direction, and are arranged so as to be adjacent to each other in the X direction. These element patterns 15B and 15D thus arranged are connected to each other through connecting portions 16B and 16D, whose both ends in the longitudinal direction (the Y direction) are formed of a non-magnetic conductive layer of copper or the like, so that a zigzag shape can be formed between the electrodes 13B and 13D and the electrodes 14B and 14D, respectively.

Figure 5A:
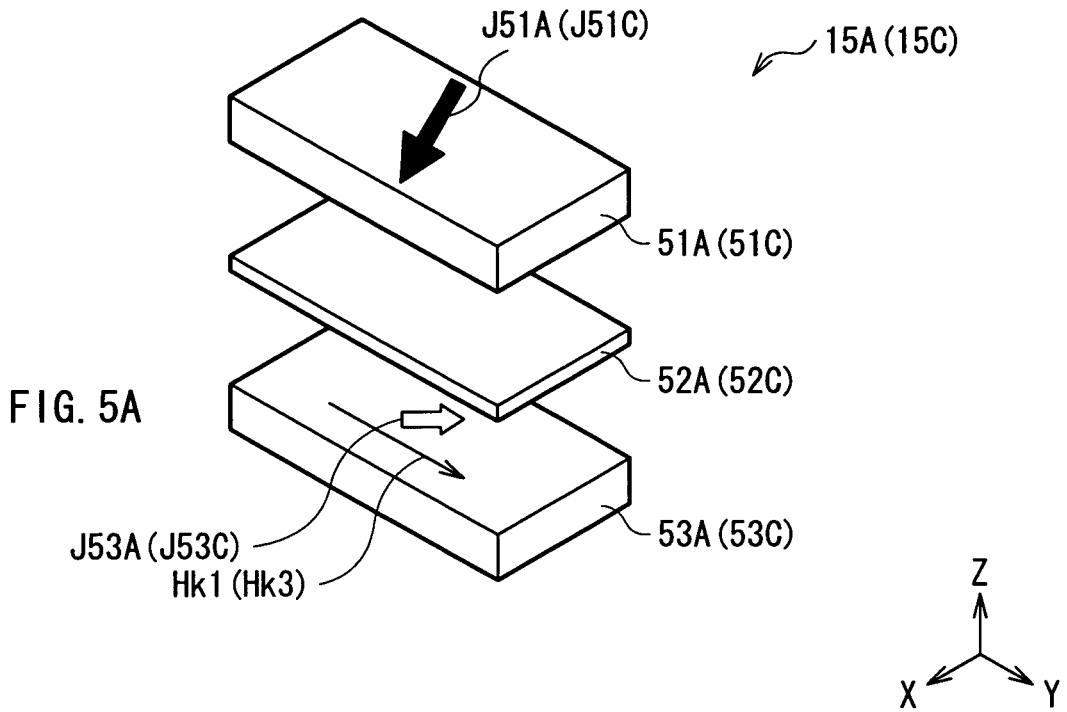
FIGS. 5A to 6B are exploded perspective views showing the configuration of element patterns shown in FIG. 4, respectively.
Figure 5B:
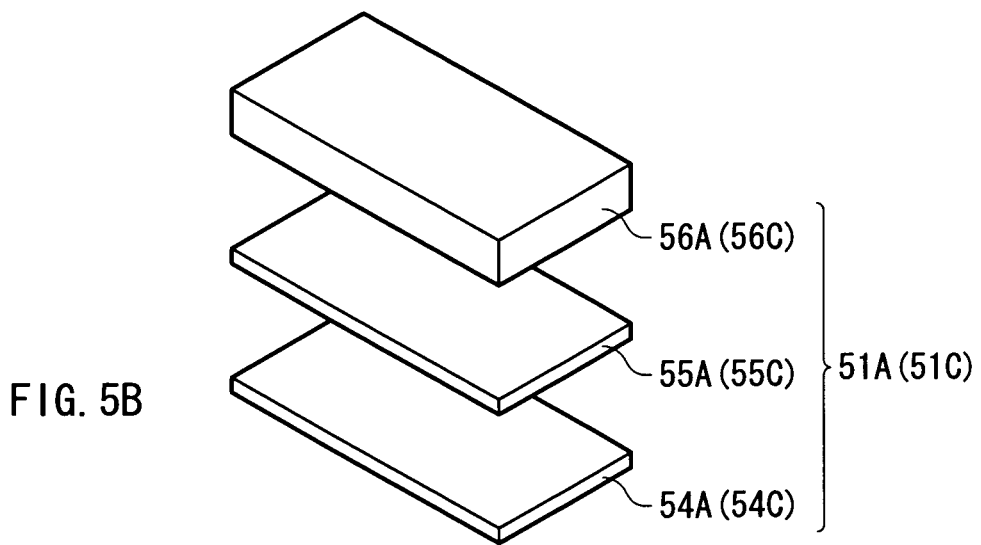
Figure 6A:
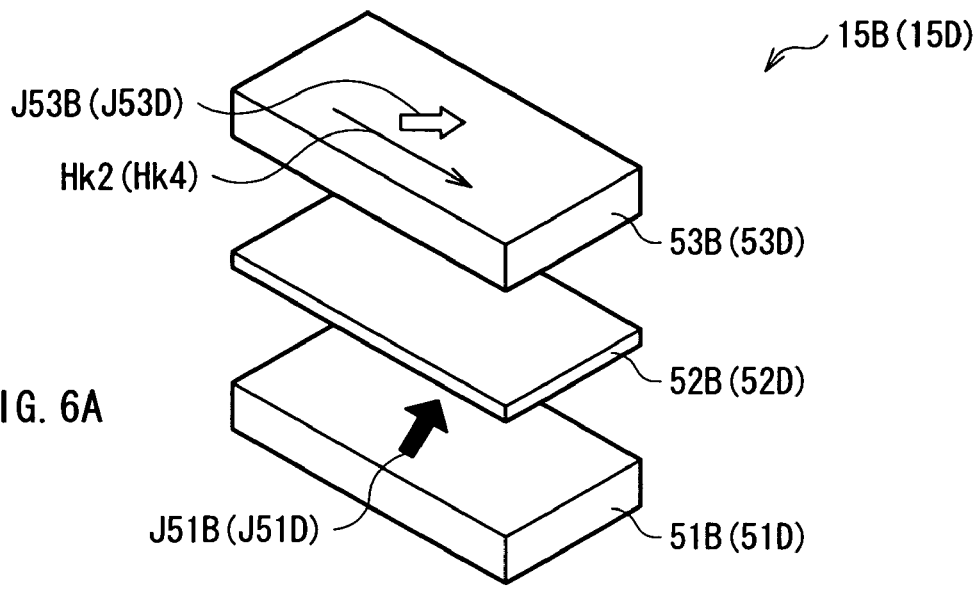
Figure 6B:
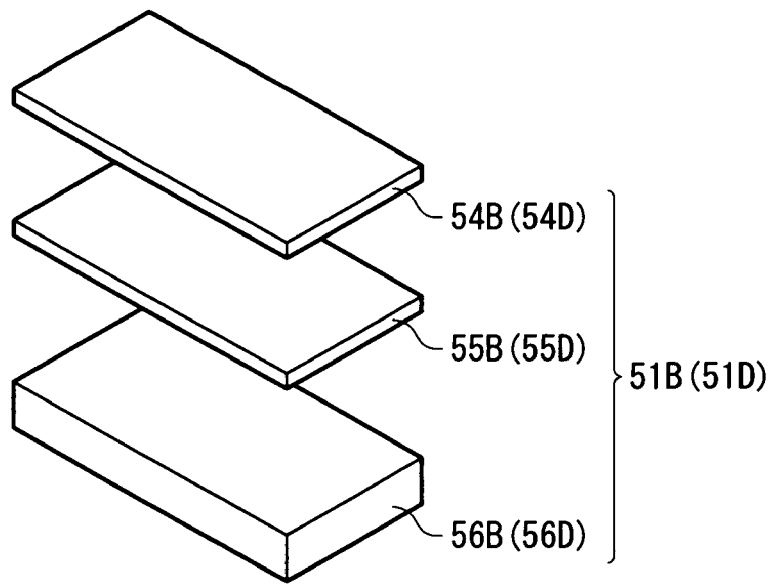

FIGS. 5A and 5B are exploded perspective views showing in enlarged dimension the element patterns 15A and 15C shown in FIG. 4A. FIGS. 6A and 6B are exploded perspective views showing in enlarged dimension the element patterns 15B and 15D shown in FIG. 4B. As shown in FIGS. 5A and 6A, the element patterns 15A to 15D have a spin-valve structure where a plurality of functional films including a magnetic layer are stacked one upon another. Specifically, (i) free layers 53A to 53D having magnetizations J53A to J53D, respectively, the direction of which is changed depending on an external magnetic field, including the detected magnetic field Hm, (ii) non-magnetic intermediate layers 52A to 52D exhibiting no specific magnetization direction, and (iii) pinned layers 51A to 51D having magnetizations J51A to J51D pinned in a certain direction, respectively, are stacked in order on the element substrates 12 and 22, respectively. The free layers 53A to 53D produce anisotropic magnetic fields Hk1 to Hk4 in the Y direction, respectively. Here, the anisotropic magnetic fields Hk1 to Hk4 mean all of anisotropic magnetic fields including anisotropic magnetic field components due to the crystalline structure of the free layers 53A to 53D, and anisotropic magnetic field components due to the shape of the free layers 53A to 53D. The directions of the magnetizations J51A to J51D of the pinned layers 51A to 51D are slightly inclined from an orthogonal axis PL orthogonal to the central axis CL, as shown in FIG. 3 and FIGS. 4A and 4B. More particularly, the directions of the magnetizations J51A and J51C are inclined from +X direction to +Y direction at an angle $\beta 1$, and the directions of the magnetizations J51B and J51D are inclined from −X direction to +Y direction at an angle $\beta 2$. Preferably, the angles $\beta 1$ and $\beta 2$ are equal to each other. The relative angles between the directions of the magnetizations J51A to 51D, and the directions of the anisotropic magnetic fields Hk1 to Hk4 are respectively greater than 0° and less than 90°.

FIGS. 4B and 5B show the detailed configurations of the pinned layers 51A to 51D, respectively. The pinned layers 51A to 51D are made up of magnetization fixing films 54A to 54D, antiferromagnetic films 55A to 55D, and protection films 56A to 56D, which are stacked in the order named from the side of the intermediate layers 52A to 52D, respectively.

The magnetization fixing films 54A to 54d are formed of a ferromagnetic material such as cobalt (Co) or cobalt-iron alloy (CoFe). The magnetization directions exhibited by the magnetization fixing films 54A to 54D become the directions of the magnetizations J51A to J51D as a whole of the pinned layers 51A to 51D, respectively. On the other hand, the antiferromagnetic films 55A to 55D are formed of an antiferromagnetic material such as platinum-manganese alloy (PtMn) or iridium-manganese alloy (IrMn). The antiferromagnetic films 55A to 55D are in the condition where a spin magnetic moment in one direction and the spin magnetic moment in the reverse direction completely cancel with each other, and function to fix the magnetization directions of the magnetization fixing films 54A to 54D. The protection films 56A to 56D are formed of a chemically stable non-magnetic material such as tantalum (Ta) or hafnium (Hf), and protect the magnetization fixing films 54A to 54D and the antiferromagnetic films 55A to 55D, respectively. The free layers 53A to 53D are formed of a soft magnetic material such as nickel-iron alloy (NiFe). The intermediate layers 52A to 52D are formed of a high-conductive non-magnetic material such as copper (Cu) or gold (Au).

Figure 7A:
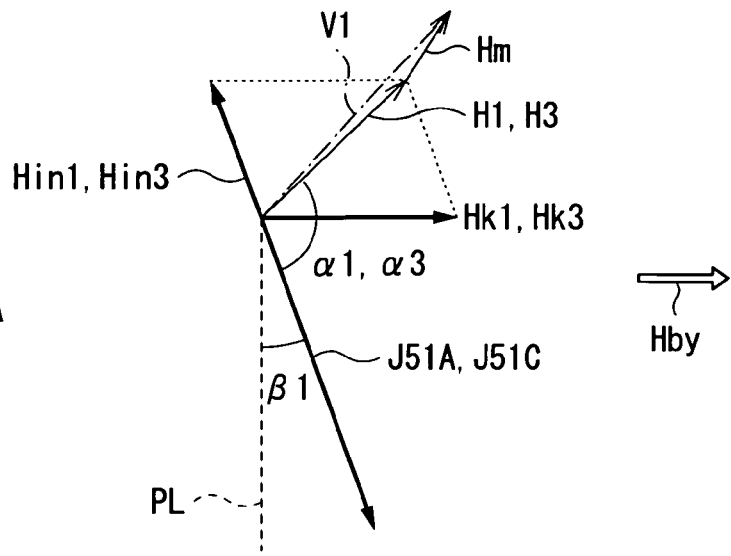
FIGS. 7A and 7B are explanatory drawings for explaining the relationship between the magnetization direction and the magnetic field direction in a key part of the first to fourth element pattern groups shown in FIG. 1.
Figure 7B:
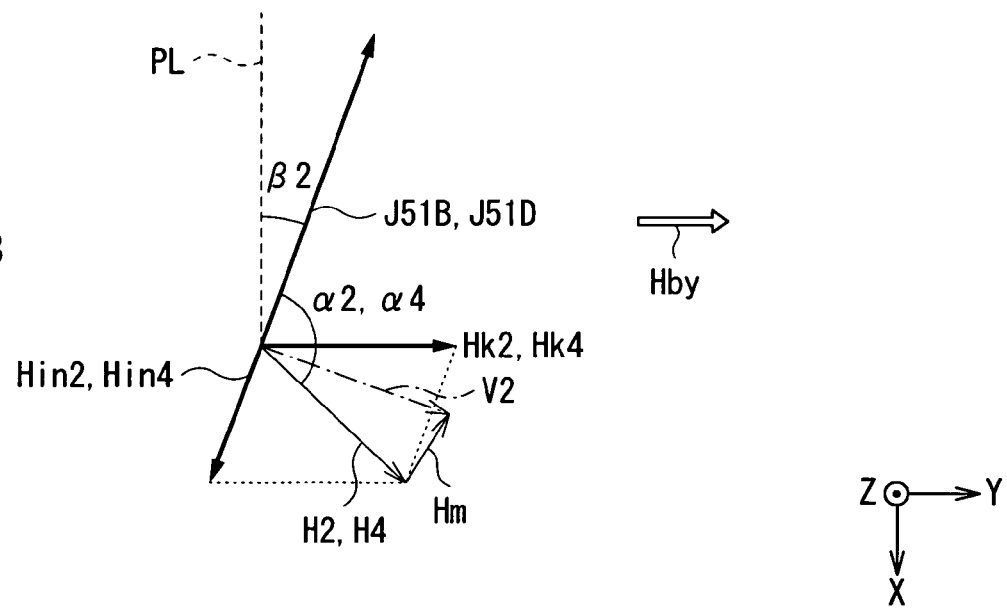

FIGS. 5A and 6A show the unloaded condition where there is no application of any external magnetic field, including the detected magnetic field Hm. In this condition, the magnetization vectors and the magnetic field vectors in the first to fourth element pattern groups 11A to 11D have a rotationally symmetrical relationship with each other around an axis parallel to the anisotropic magnetic fields Hk1 to Hk4 (i.e. the central axis CL). Specifically, the magnetizations J53A and J53C of the free layers 53A and 53C are directed to the directions of composite magnetic fields H1 and H3 resulting from exchange-coupling magnetic fields Hin1 and Hin3 generated between the pinned layer 51A, 51C and the free layer 53A, 53C, and the anisotropic magnetic fields Hk1 and Hk3 of the free layers 53A and 53C, respectively (refer to FIG. 7A). Similarly, the magnetizations J53B and J53D of the free layers 53B and 53D are directed to the directions of composite magnetic fields H2 and H4 resulting from exchange-coupling magnetic fields Hin2 and Hin4 generated between the pinned layer 51B and 53D, and the free layer 53B and 53D, and the anisotropic magnetic fields Hk2 and Hk4 of the free layers 53B and 53D (refer to FIG. 7B). On the other hand, the magnetizations J51A and J51C of the pinned layers 51A and 51C are directed in a direction to form a relative angle of greater than 0° and less than 90°, with respect to the anisotropic magnetic fields Hk1 and Hk3, respectively. For example, there are formed angles $\alpha 1$ and $\alpha 3$ with respect to the composite magnetic fields Hk1 and Hk3, respectively. Similarly, the magnetizations J51B and J51D of the pinned layers 51B and 51D are directed in a direction to form a relative angle of greater than 0° and less than 90°, with respect to the anisotropic magnetic fields Hk2 and Hk4, respectively. For example, there are formed angles $\alpha 2$ and $\alpha 4$ with respect to the composite magnetic fields H2 and H4, respectively. Preferably, each of the angles $\alpha 1$ to $\alpha 4$ is 90°, irrespective of the presence or absence of the detected magnetic field Hm. This is because the abovementioned configuration enables the element patterns 15A to 15D to produce maximum outputs. The exchange-coupling magnetic fields Hin1 and Hin3 have opposite vectors to the magnetizations J51A and J51C, respectively. The exchange-coupling magnetic fields Hin2 and Hin4 have opposite vectors to the magnetizations J51B and J51D, respectively. Preferably, the magnetizations J51A and J51C, the anisotropic magnetic fields Hk1 and Hk3, and the exchange-coupling magnetic fields Hin1 and Hin3 in the element patterns 15A and 15C are equal to the magnetizations J51B and J51D, the anisotropic magnetic fields Hk2 and Hk4, and the exchange-coupling magnetic field Hin2 and Hk4 in the element patterns 15B and 15D, respectively. FIGS. 7A and 7B are explanatory drawings for explaining the directions and magnitudes of the magnetizations, and the directions and magnitudes of the magnetic fields in the element patterns 15A to 15D, respectively.

The magnetic direction sensor can be suitably used for detecting an extremely minute magnetic vector (the detected magnetic field Hm) such as geomagnetism. The following is the case of detecting the detected magnetic field Hm to be rotated in the XY plane. For example, when measuring geomagnetism, the module substrate 19 may be positioned parallel to the ground.

In the element patterns 15A to 15D, the respective stacked surfaces are formed so as to be parallel to the plane of rotation of the detected magnetic field Hm. For example, when the detected magnetic field Hm is applied to the element patterns 15A and 15C, as shown in FIG. 7A, the magnetizations J53A and J53C of the free layers 53A and 53C are changed to the direction of a composite vector V1 resulting from the composite magnetic fields H1 and H3 and the detected magnetic field Hm. At this time, the angle between the magnetization J51A and J51C, and the magnetization J53A and J53C is greater than the angle α1, and therefore the resistance values R1 and R3 of the first and third element pattern groups 11A and 11C are increased. On the other hand, the detected magnetic field Hm in the same direction as in FIG. 7A is also applied to the element patterns 15B and 15D, as shown in FIG. 7B, and therefore the magnetizations J53B and J53D of the free layers 53B and 53D are changed to the direction of a composite vector V2 resulting from the composite magnetic fields H2 and H4 and the detected magnetic field Hm. At this time, the angle between the magnetization J51B and the magnetization J53B is smaller than the angle α2, and therefore the resistance values R2 and R4 of the second and fourth element pattern groups 11B and 11D are decreased. Thus, the resistance values R1 and R3 of the first and third element pattern groups 11A and 11C, and the resistance values R2 and R4 of the second and fourth element pattern groups 11B and 11D are configured to exhibit changes in the opposite directions to each other.

Figure 8:
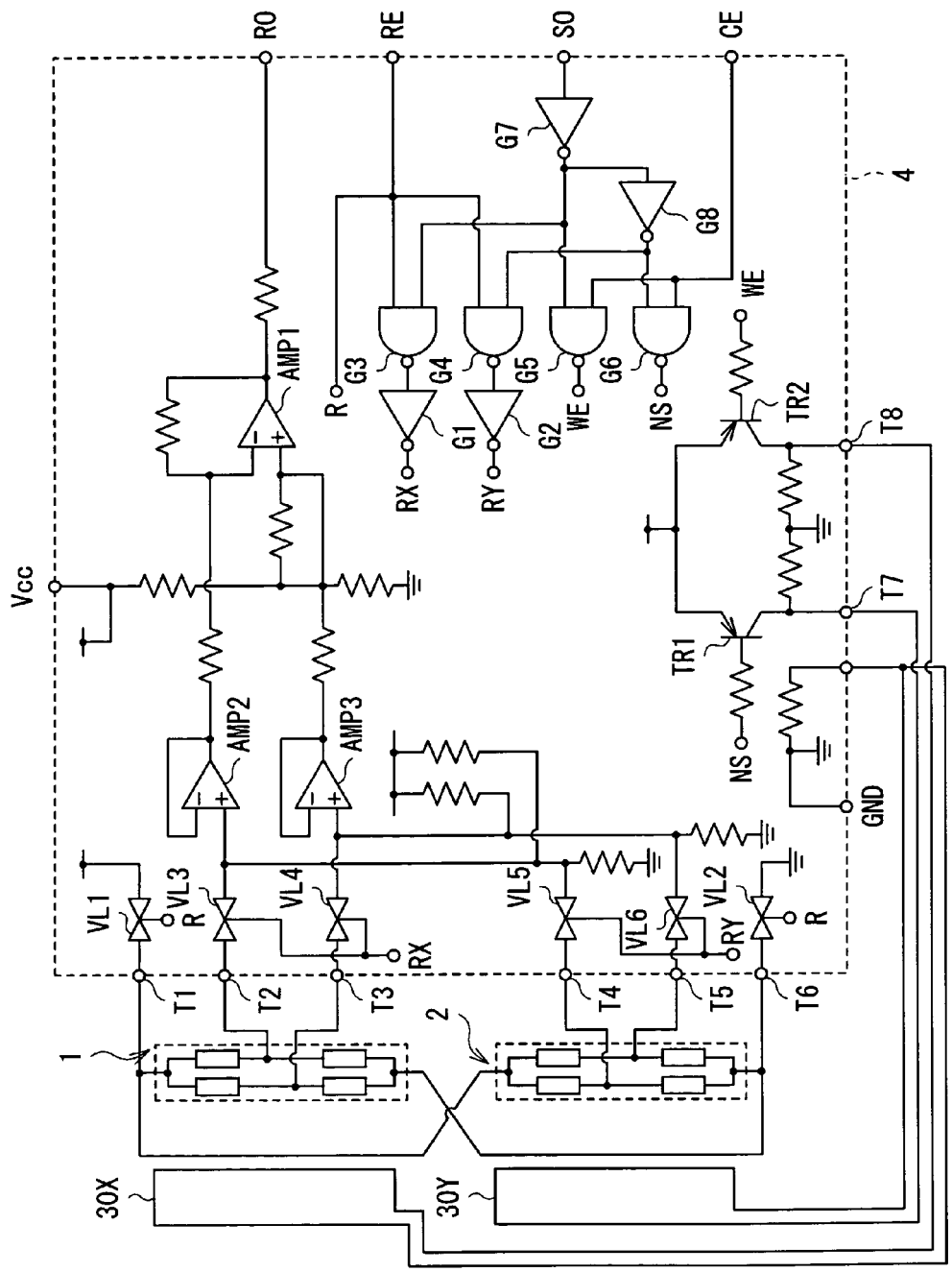
FIG. 8 is a circuit diagram showing the entire circuit configuration of the measuring section in FIG. 1.

The circuit configuration of the measuring section 100 will next be described. FIG. 8 shows the entire circuit configuration, and FIG. 9 shows a key part thereof.

As shown in FIG. 8, the first and second MR elements 1 and 2, and the coils 30Y and 30X are connected to the drive circuit 4. The drive circuit 4 is provided with a read-only terminal RO, a read enable RE, a select terminal SO, a coil enable CE and terminals T1 to T8, and the like. The drive circuit 4 is connected to the outside with these in between. Current is supplied from a power source Vcc to the drive circuit 4. Each one end of the first and second MR elements 1 and 2 is connected to the terminal T1 so that current can be supplied thereto through a valve VL1, and the other end is connected to the terminal T6 so as to be grounded through a valve VL2. The read enable RE, the select terminal SO and the coil enable CE are connected to a control circuit (not shown) so that predetermined control signals can be inputted them, respectively.

Figure 9:
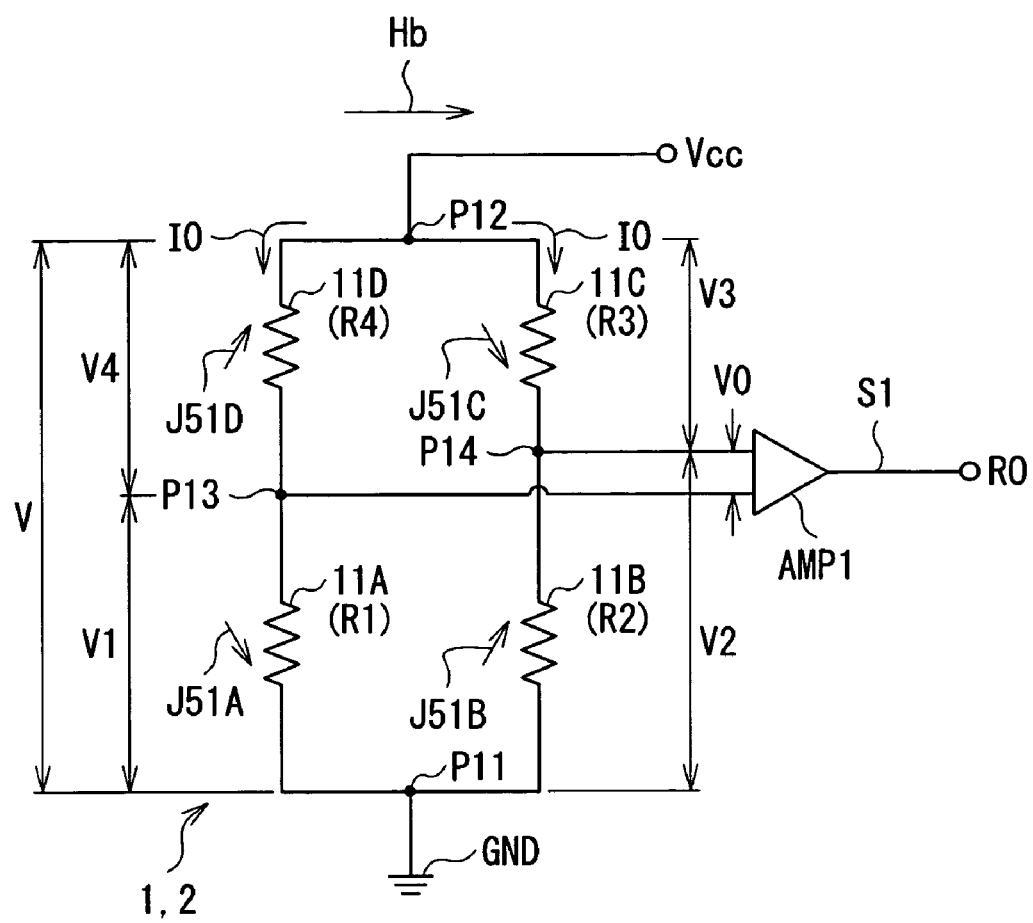
FIG. 9 is a circuit diagram showing a key part of the circuit configuration of the measuring section in FIG. 8.

The circuit configurations of the first and second MR elements 1 and 2 are as shown in FIG. 9. Here, the first to fourth element pattern groups 11A to 11D form a bridge circuit. Specifically, one end of the first element pattern group 11A and one end of the second element pattern group 11B are connected to each other at a first connecting point P11. One end of the third element pattern group 11C and one end of the fourth element pattern group 11D are connected to each other at a second connecting point P12. The other end of the first element pattern group 11A is connected to the other end of the fourth element pattern group 11D at a third connecting point P13. The other end of the second element pattern group 11B is connected to the other end of the third element pattern group 11C at a fourth connecting point P14. The respective first connecting points P11 are connected to the terminal T6, and the respective second connecting points P12 are connected to the terminal T1. The fourth and third connecting points P14 and P13 as the middle points of the bridge circuit of the first MR element 1 are connected to the terminals T2 and T3, respectively, and connected to amplifiers AMP2 and AMP3 through valves VL3 and VL4, respectively. Similarly, the fourth and third connecting points P14 and P13 as the middle points of the bridge circuit of the second MR element 2 are connected to the terminals T4 and T5, and connected to input side terminals of the amplifiers AMP2 and AMP3 through valves VL5 and VL6, respectively. The output side terminals of the amplifiers AMP2 and AMP3 are connected to the input side terminal of the amplifier AMP1 through predetermined resistors, respectively. Here at, the same amplifiers AMP1 to AMP3 are connected to the first and second MR elements 1 and 2. This is desirable for reducing variations in measured values and achieving a compact entire configuration.

The valves VL3 and VL4 are connected to a terminal RX, and an instruction signal inputted to the terminal RX is used to perform switching between a communicating state and a non-communicating state. Similarly, the valves VL5 and VL6 are connected to a terminal RY, and an instruction signal inputted to the terminal RY is used to perform switching between a communicating state and a non-communicating state. The terminals RX and RY are connected to the output sides of NOT gates G1 and G2, respectively. The input sides of the NOT gates G1 and G2 are connected to the output sides of NAND gates G3 and G4, respectively. The NAND gates G3 and G4 are connected to the read enable RE, to which a read permission signal is to be inputted. The other input terminal of the NAND gate G3 is connected through a NOT gate G7 to the select terminal SO, and the other input terminal of the NAND gate G4 is connected through the NOT gate G7 and a NOT gate G8 to the select terminal SO. A select signal, by which the first MR element 1 or the second MR element 2 is selected and activated, is inputted to the select terminal SO. The select terminal SO is connected through the NOT gate G7 to a NAND gate G5, and a terminal WE is provided on the output side of the NAND gate G5. The select terminal SO is also connected to a NAND gate G6 through the NOT gate G7 and the NOT gate G8, and a terminal NS is provided on the output side of the NAND gate G6. The terminals WE and NS are connected through the NAND gates G5 and G6 to the coil enable CE, respectively, and a coil drive signal is inputted to these terminals.

The terminals WE and NS are connected through predetermined resistors to the bases of transistors TR and TR2, respectively. The emitter sides of the transistors TR1 and TR2 are connected to the power source Vcc, and the collector sides of the transistors TR1 and TR2 are connected through the terminals T7 and T8 to one end of the coil 30Y and one end of the coil 30X, respectively. The other ends of the coils 30Y and 30X are grounded. Thus, based on the coil drive signal inputted from the terminal NS, current is supplied to the coil 30Y, and the bias magnetic field Hby is generated. Based on the coil drive signal inputted from the terminal WE, current is supplied to the coil 30X, and the bias magnetic field Hbx is generated.

The operation of the measuring section 100 will be described below with reference to FIGS. 10A to 10I and FIG. 11. FIGS. 10A to 10I are timing waveform diagrams for explaining the operation of the measuring section 100. FIG. 11 shows in enlarged dimension a part thereof. Output signals read at the respective timings are variable in response to the attitude of the magnetic direction sensor (the relative angle with the direction of geomagnetism). These will be described later.

Figure 10:
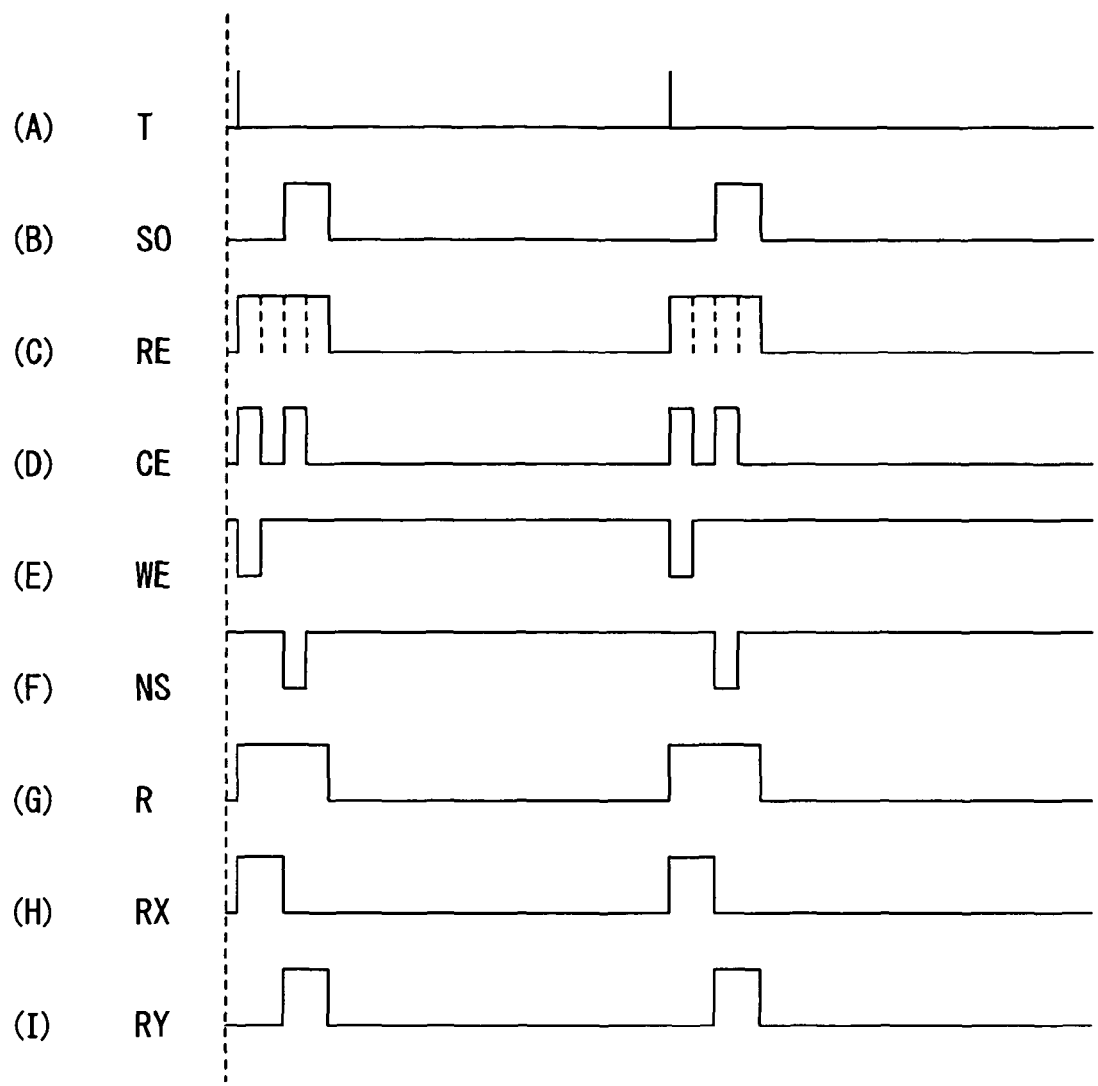
FIGS. 10A to 10I are timing waveform diagrams for explaining the operation of the measuring section in FIG. 1.
Figure 11:
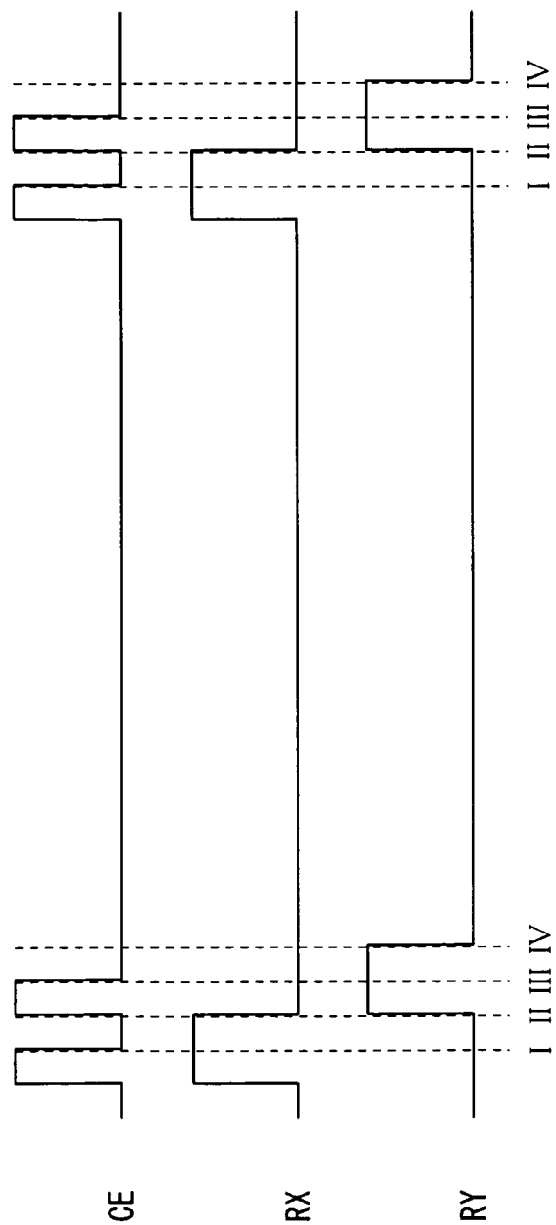
FIG. 11 is a timing waveform diagram showing in enlarged dimension a part of FIGS. 10A to 10I.

FIG. 10A shows a timer signal T to be generated periodically from a counter (not shown). FIG. 10B shows a select signal inputted from the select terminal SO (this signal is for switching between the first MR element 1 and the second MR element 2, from which an output signal is taken out). FIG. 10C shows a read permission signal inputted to the read enable RE (this signal is for instructing the timing of a read operation). FIG. 10D shows a coil drive signal inputted to the coil enable CE (this signal is for permitting the drive of either the coil 30Y or 30X. FIG. 10E shows a coil drive signal inputted to the terminal WE (this signal is for permitting the drive of the coil 30X). FIG. 10F shows a coil drive signal inputted to the terminal NS (this signal is for permitting the drive of the coil 30Y). FIG. 10G shows a valve drive signal inputted to the terminal R (this signal is for bringing the valves VL1 and VL2 into their on states). FIG. 10H shows a valve drive signal inputted to the terminal RX (this signal is for bringing the valves VL3 and VL42 into their on states). FIG. 10I shows a valve drive signal inputted to the terminal RY (this signal is for bringing the valves VL5 and VL6 into their on-states).

When the timer signal T is inputted to a controller (not shown), a read permission signal is inputted from the controller to the read enable RE. At this time, no select signal is inputted to the select terminal S (that is, the first MR element 1 remains selected). As a result, the valve drive signal is inputted to the terminal R and the terminal RX, so that the valves VL1, VL3 and VL4 are turned on and enabled for reading from the first MR element 1. On the other hand, the coil drive signal is inputted from the controller to the coil enable CE, so that the transistor TR2 is turned on, and a predetermined current is passed through the coil 30X, thereby generating the bias magnetic field Hby. At this timing (the timing I shown in FIG. 11), the information of the first MR element 1 with the bias magnetic field Hby applied can be read. A differential signal to be read from the read-only terminal RO is expressed as an output signal Xs.

Upon the completion of the readout of the output signal Xs, the coil drive signal from the controller to the coil enable CE is discontinued, and the transistor TR2 is turned off. As a result, the bias magnetic field Hby applied to the first MR element 1 is eliminated. Whereas the read permission signal from the controller to the read enable RE remains inputted. This permits read of the information of the first MR element 1 with the bias magnetic field Hby unapplied. A differential signal to be read from the read-only terminal RO at this timing (the timing II shown in FIG. 11) is expressed as an output signal X.

After the output signal X is read, in a state in which the read permission signal remains inputted to the read enable RE, a select signal is inputted from the controller to the select terminal SO (that is, the second MR element 2 is selected). As a result, valve drive signals are inputted to the terminal R and the terminal RY, respectively, and the valves VL2, VL5 and VL6 are turned on and enabled for reading from the second MR element 2. Naturally, the valves VL1, VL3 and VL4 are turned off and disabled for reading from the first MR element 1. On the other hand, a coil drive signal is inputted from the controller to the coil enable CE, so that the transistor TR1 is turned on, and a predetermined current is passed through the coil 30Y, thereby generating the bias magnetic field Hbx. At this timing (the timing III shown in FIG. 11), the information of the second MR element 2 with the bias magnetic field Hbx applied can be read. A differential signal to be read from the read-only terminal RO is expressed as an output signal Ys.

Upon the completion of the readout of the output signal Ys, the coil drive signal from the controller to the coil enable CE is discontinued, and the transistor TR1 is turned off. As a result, the bias magnetic field Hbx applied to the second MR element 2 is eliminated. Whereas the read permission signal and the select signal from the controller remain inputted to the read enable RE and the select terminal SO, respectively. This permits read of the information of the second MR element 2 with the bias magnetic field Hby unapplied. A differential signal to be read from the read-only terminal RO at this timing (the timing IV shown in FIG. 11) is expressed as an output signal Y.

In this magnetic direction sensor, by using the four output signals Xs, X, Ys and Y read at different timings as described above, measured value errors made by manufacturing errors and the like in the first and second MR elements 1 and 2, and the coils 30X and 30Y can be corrected to achieve higher precision detection of magnetic directions. The reason why the read operation of the output signals Xs and X from the first MR element 1, and the read operation of the output signals Ys and Y from the second MR element 2 are performed at the different timings is to avoid mutual interference between the bias magnetic field Hby by the coil 30X and the bias magnetic field Hbx by the coil 30Y.

Figure 12:
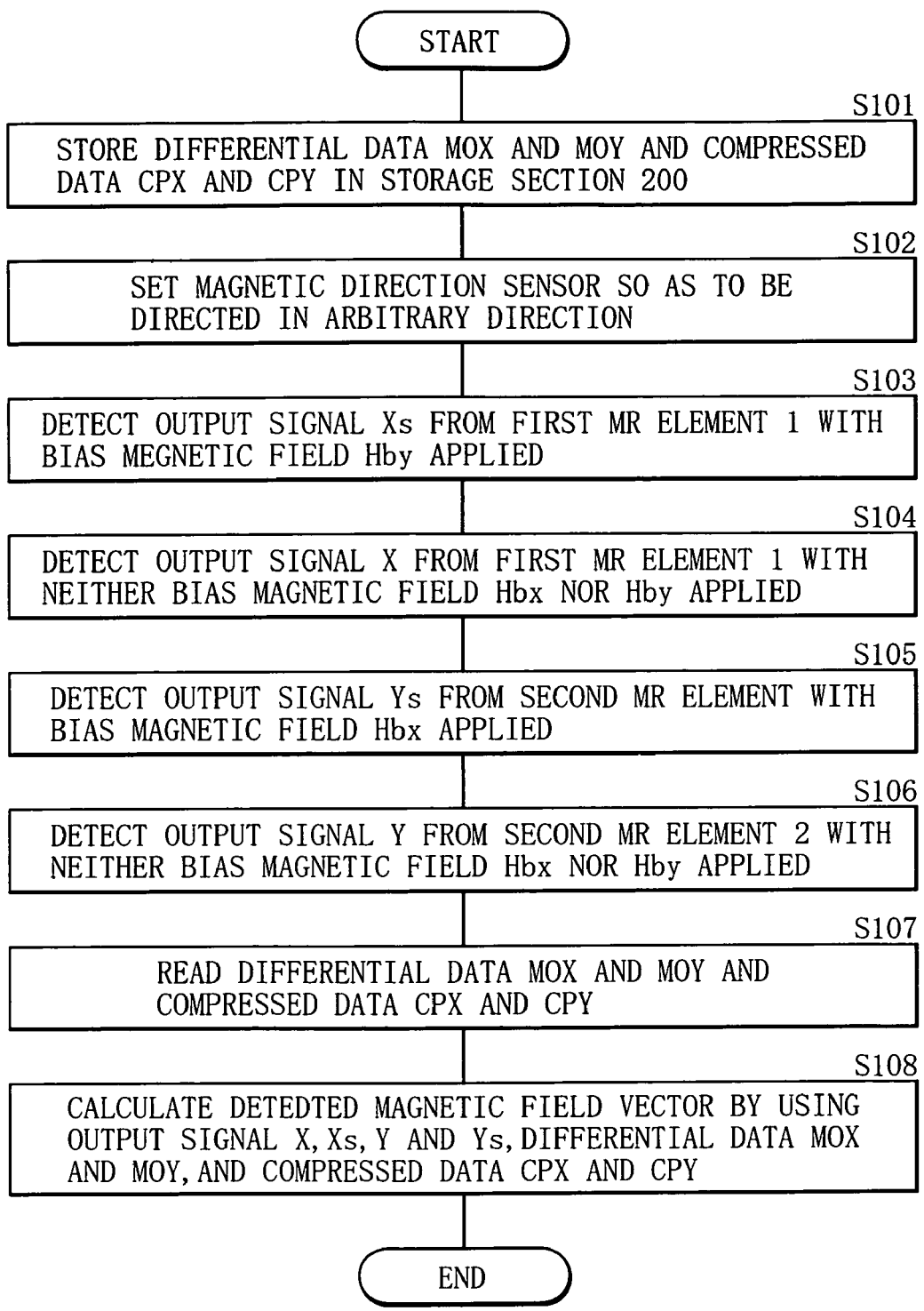
FIG. 12 is a flow chart showing the outline of the procedure of measuring a geomagnetism vector.

Next, a method of detecting a magnetic direction using the above magnetic direction sensor will be described with reference to FIG. 12. The following is the case where the geomagnetism Ht is the detected magnetic field Hm, and its vector (the magnitude of the geomagnetism Ht and the direction of the magnetic direction sensor) is measured. The method of detecting a magnetic field according to the present invention is included in the following method of detecting a magnetic direction. FIG. 12 is a flow chart showing the outline of the procedure of measuring the vector of the geomagnetism Ht.

Firstly, the differential data MOX and MOY and the compressed data CPX and CPY measured by the measuring section 100 are stored in the differential data storing section 210 and the compressed data storing section 220 in the storage section 200, respectively (step S101). The magnetic direction sensor is set so that it is directed to an arbitrary direction (step S102). Thereafter, the output signal Xs from the first MR element 1 is detected with the bias magnetic field Hby applied (step S103), and the output signal X from the first MR element 1 is detected with neither the bias magnetic fields Hbx nor Hby applied (step S104). Subsequently, the output signal Ys from the second MR element 2 is detected with the bias magnetic field Hbx applied (step S105), and then the output signal Y from the first MR element 2 is detected with neither the bias magnetic fields Hbx nor Hby applied (step S106). Finally, the differential data MOX and MOY and the compressed data CPX and CPY are read from the storage section 200 (step S107), and the vector of the geomagnetism Ht as the detected magnetic field Hm is calculated by using the differential data MOX and MOY and the compressed data CPX and CPY, and the detected output signals Xs, X, Ys and Y (step S108).

In step S108, the vector of geomagnetism is calculated as follows. Firstly, a first component Hx in the same direction as a direction in which the resistance value of the first MR element 1 becomes an extreme in the vector of the geomagnetism Ht, is calculated based on the following equation (2).

$$Hx=(X-Xs-MOX)/(1-CPX) \quad (2)$$

Then, a second component Hy in the same direction as a direction in which the resistance value of the second MR element 2 becomes an extreme in the vector of the geomagnetism Ht, is calculated based on the following equation (3).

$$Hy=(Y-Ys-MOY)/(1-CPY) \quad (3)$$

Figure 13:
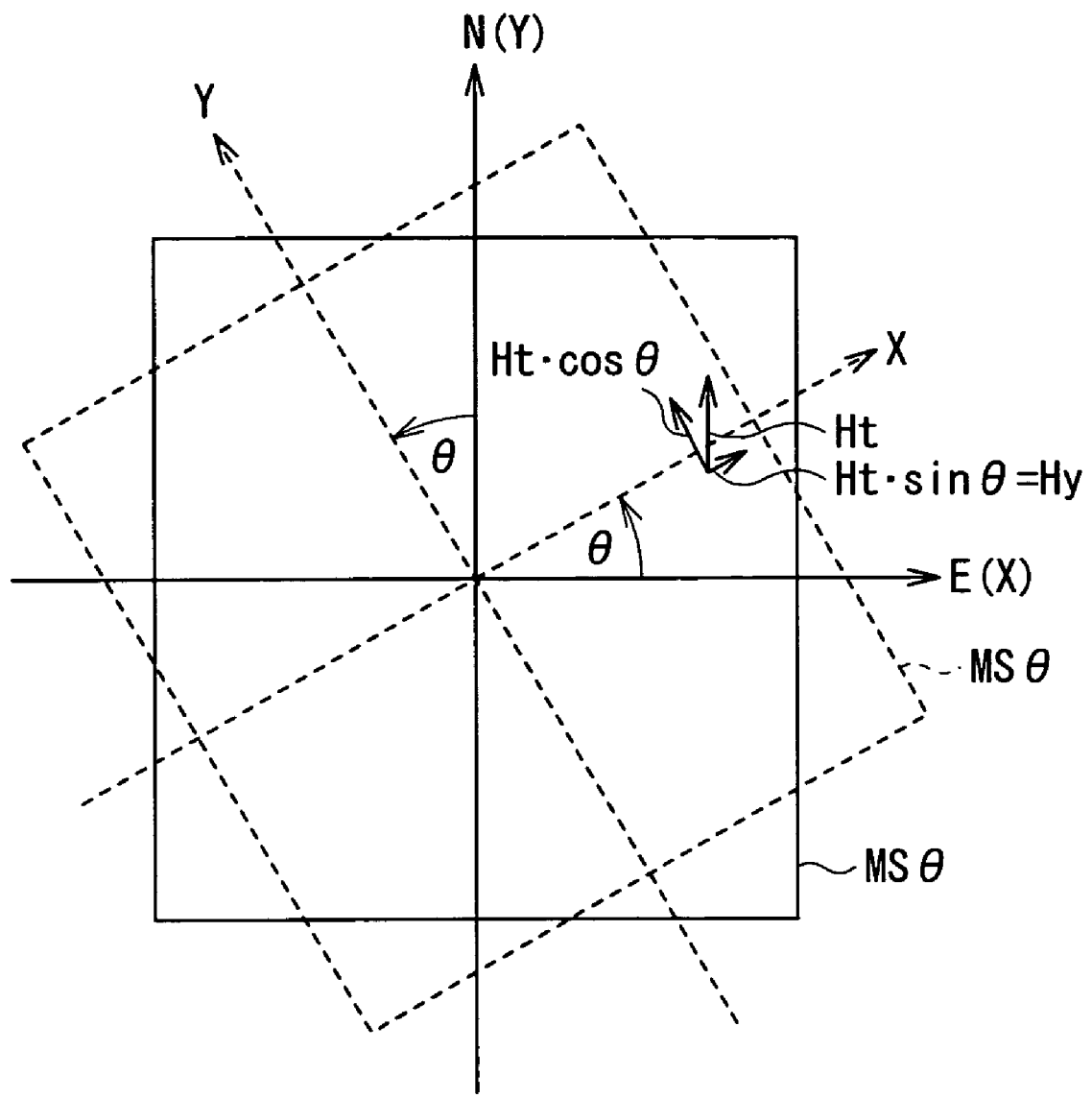
FIG. 13 is an explanatory drawing for explaining the concept of first and second components of a geomagnetism detected by the magnetic direction sensor in FIG. 1.

The first component Hx and the second component Hy have the following concepts. As shown in FIG. 13, in the magnetic direction sensor, it is assumed that the X direction in an initial position Mso is an east direction E, and the Y direction is a north direction N. The vector of the geomagnetism Ht is directed to the north direction N. Supposing that the direction of the magnetic direction sensor is rotated by an angle θ from the initial position MSo, and shifted to a position MS θ, the vector of the geomagnetism Ht can be dissolved into the first component Hx in the X direction, and the second component $H_y$ in the Y direction. Using the angle θ, the first component Hx and the second component Hy can be expressed as Ht×sin θ and Ht×cos θ, respectively. When the angle θ is changed in the range from 0° to 360°, the first and second MR elements 1 and 2 show output changes as shown in FIG. 14, on which the abscissa represents the angle θ (a rotational angle from a reference position) and the ordinate represents output (standardized by setting the maximum vale as 1).

Accordingly, the magnitude of the geomagnetism Hm can be determined by using the first component Hx and the second component Hy, based on the following equation (4).

$$Hm=\{(Hx)^2+(Hy)^2\}\}^{0.5} \quad (4)$$

Figure 14:
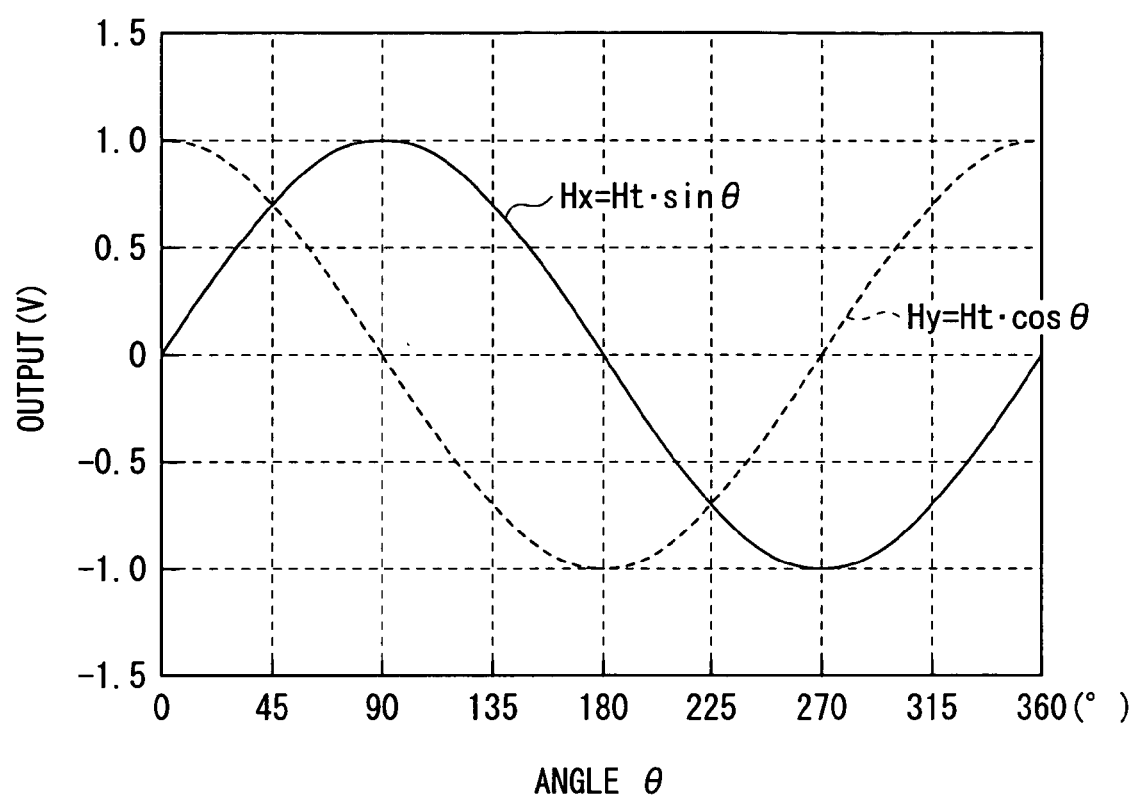
FIG. 14 is a characteristic diagrams showing the relationship between the outputs of the first and second MR elements, and angles.

Further, the angle θ can be uniquely found from a combination of the numeral values of the first component Hx and the second component Hy, as shown in FIG. 14, and it is therefore capable of confirming the direction to which the magnetic direction sensor is directed (namely, the attitude thereof).

Here, the differential data MOX and MOY are based on a differential between the resistance values of the first and second MR elements 1 and 2 with the bias magnetic field Hby or the bias magnetic field Hbx applied, and the resistance values of the first and second MR elements 1 and 2 with neither the bias magnetic field Hby nor the bias magnetic field Hbx applied, when the magnetic sensor changes its own attitude direction so that the direction of the bias magnetic field Hby or the bias magnetic field Hbx corresponds with a first direction (for example, the north direction). On the other hand, the compressed data CPX and CPY are based on the ratio between the displacements of the resistance values of the first and second MR elements 1 and 2 with neither the bias magnetic field Hby nor the bias magnetic field Hbx applied, and the displacements of the resistance values of the first and second MR elements 1 and 2 with the bias magnetic field Hby or the bias magnetic field Hbx applied, when the attitude of the magnetic direction sensor itself is changed so that the direction of the bias magnetic field Hby or the bias magnetic field Hbx can be shifted from the first direction (for example, the north direction) to a second direction different therefrom (for example, the east direction).

Figure 15:
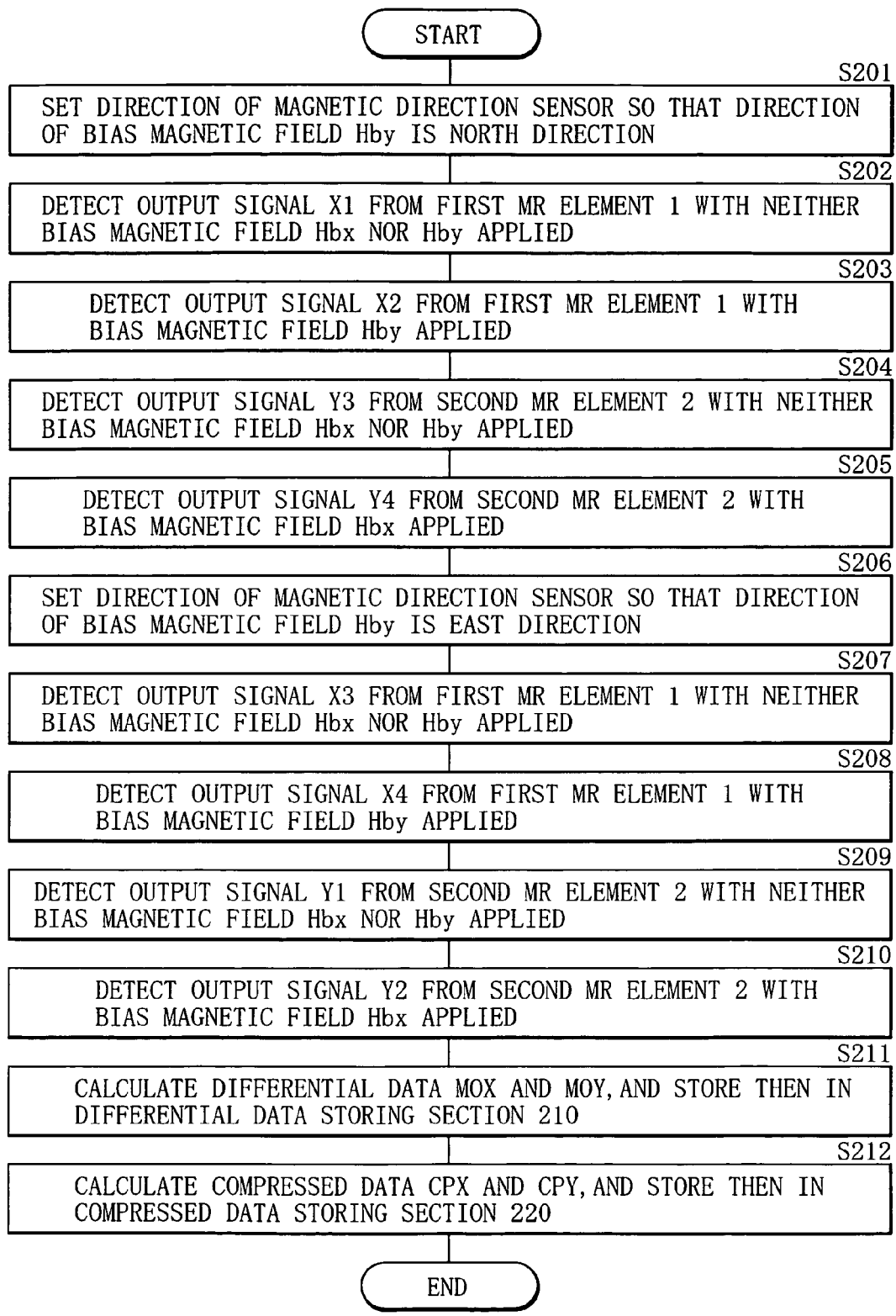
FIG. 15 is a flow chart showing the procedure from the step of calculating fixed data of the first and second MR elements to the step of storing the fixed data in a storage section.
Figure 16:
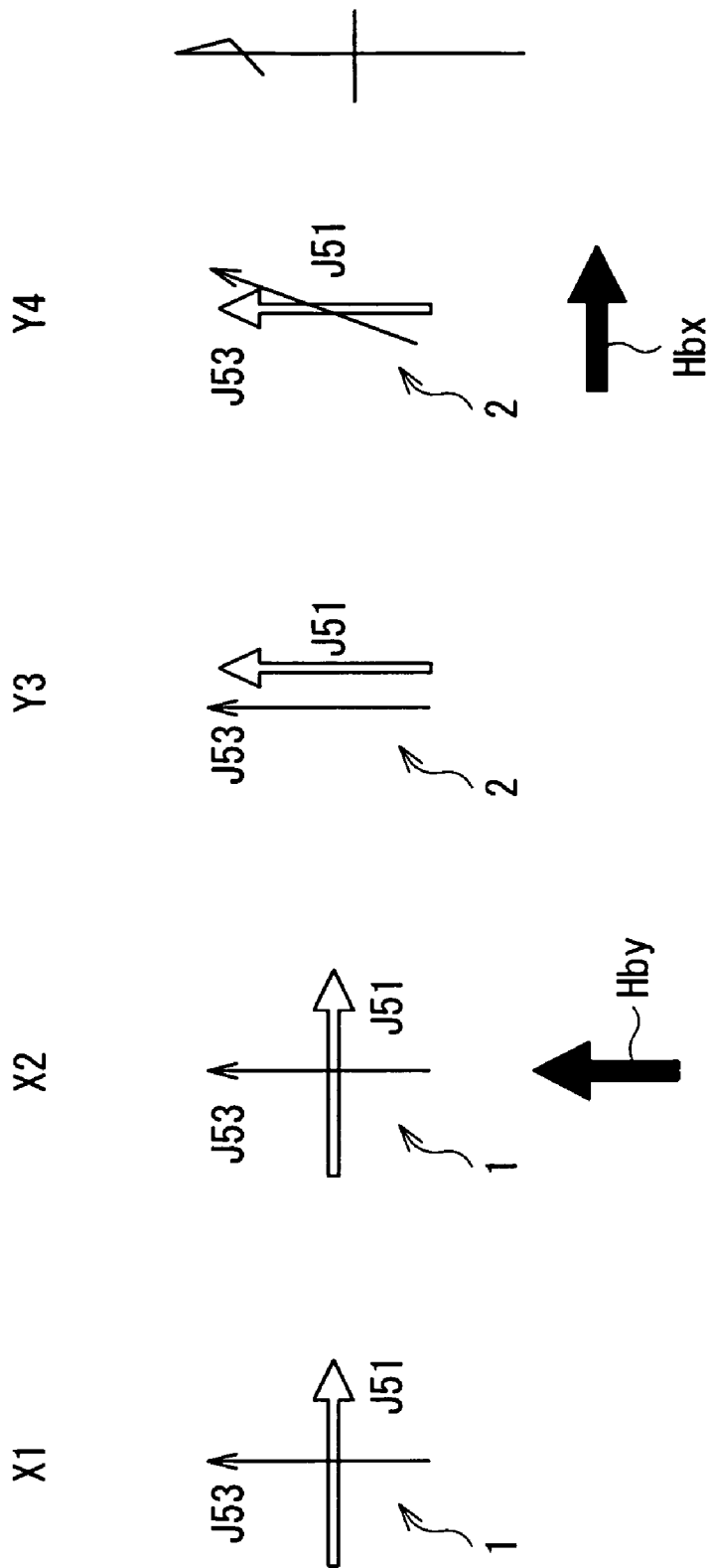
FIGS. 16A to 16D are conceptual diagrams for explaining the relationship between magnetization direction and magnetic field direction, etc. when calculating the fixed data of the first and second MR elements.
Figure 17:
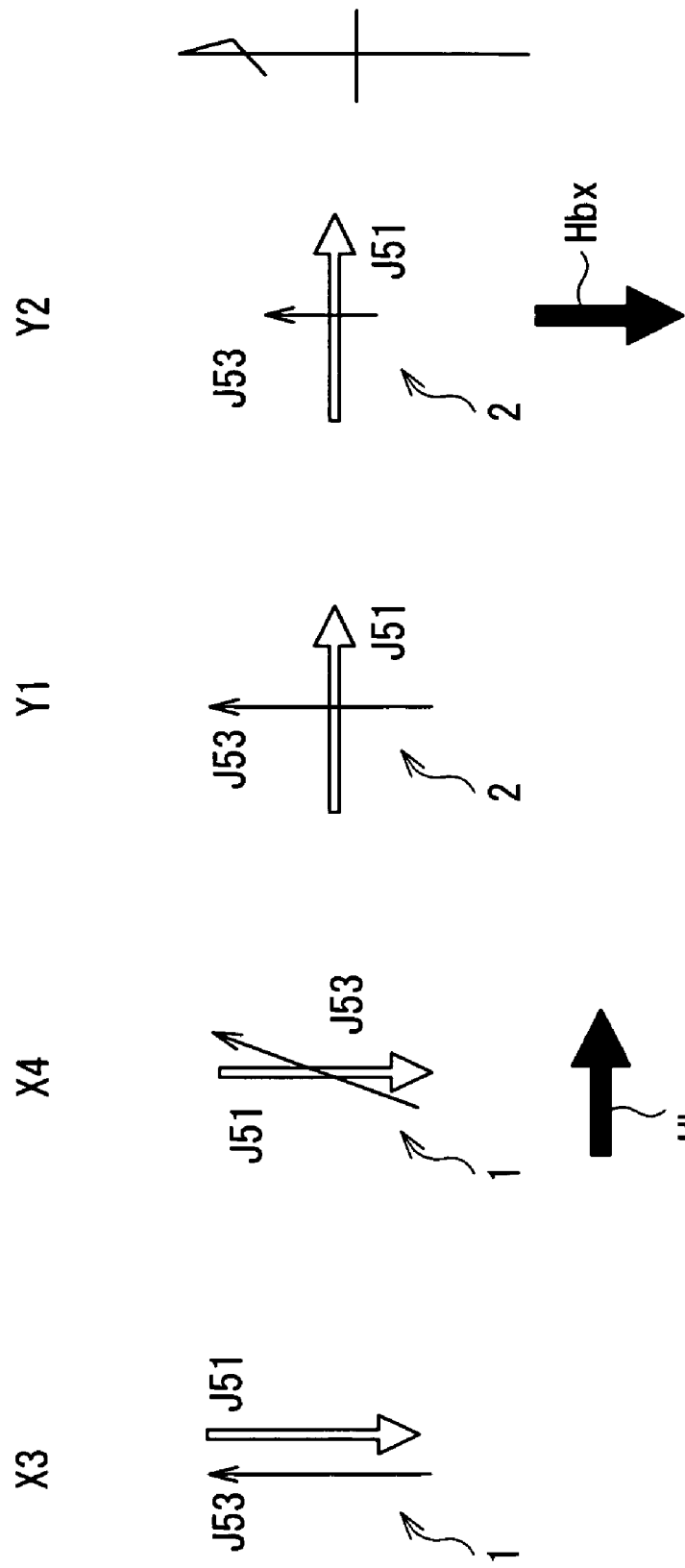
FIGS. 17A to 17D are other conceptual diagrams for explaining the relationship between magnetization direction and magnetic field direction, etc. when calculating the fixed data of the first and second MR elements.

The way to obtain these differential data MOX and MOY and these compressed data CPX and CPY (namely, the fixed data of the first and second MR elements 1 and 2) will be described with reference to FIG. 15 to 17. FIG. 15 is a flow chart showing the procedure from the step of calculating fixed data of the first and second MR elements 1 and 2, to the step of storing the fixed data in the storage section 200. FIGS. 16 and 17 are explanatory drawings for explaining the relationship between the magnetization direction and the magnetic field direction, etc. when calculating the fixed data of the first and second MR elements 1 and 2. Specifically, FIGS. 16 and 17 show ideal states where there exists no external magnetic field other than the geomagnetism Ht and the bias magnetic field Hb, and show the case where for the purpose of simplification, the direction of the magnetization J53 of the free layer 53 and the direction of the magnetization J51 of the pinned layer 51 are completely orthogonal to each other, without considering the anisotropic magnetic fields Hk, the exchange-coupling magnetic fields Hin and the like.

Firstly, as shown in FIG. 16, the direction of the magnetic direction sensor is set so that the bias magnetic field Hby is directed to the north direction (step S201). Then, an output signal X1 (a first output signal) from the first MR element 1 is detected with neither the bias magnetic field Hbx nor Hby applied (refer to FIG. 16A) (step S202), and an output signal X2 (a second output signal) from the first MR element 1 is detected with the bias magnetic field Hby applied (refer to FIG. 16B) (step S203). Holding the direction of the magnetic direction sensor, an output signal Y3 (a seventh output signal) from the second MR element 2 with neither the bias magnetic field Hbx nor Hby applied (refer to FIG. 16C) (step S204), and an output signal Y4 (an eighth output signal) from the second MR element 2 is detected with the bias magnetic field Hbx applied (refer to FIG. 16D) (step S205).

Subsequently, the direction of the magnetic direction sensor is set so that the bias magnetic field Hby is directed to the east direction (step S206). Then, an output signal X3 (a third output signal) from the first MR element 1 is detected with neither the bias magnetic field Hbx nor Hby applied (step S207), and an output signal X4 (a fourth output signal) from the first MR element 1 is detected with the bias magnetic field Hby applied (refer to FIG. 17B) (step S208). Then, an output signal Y1 (a fifth output signal) from the second MR element 2 with neither the bias magnetic field Hbx nor Hby applied (refer to FIG. 17C) (step S209), and an output signal Y2 (a sixth output signal) from the second MR element 2 is detected with the bias magnetic field Hbx applied (refer to FIG. 17D) (step S210).

From the output signals X1 to X4 and Y1 to Y4 thus obtained, differential data MOX and MOY and compressed data CPX and CPY are calculated, and these data are then stored in the differential data storing section 210 and the compressed data storing section 220, respectively (steps S211 and S212). The differential data MOX and MOY and the compressed data CPX and CPY can be calculated based on the following equations (5) to (8), respectively.

$$MOX=X1-X2 \quad (5)$$

$$MOY=Y1-Y2 \quad (6)$$

$$CPX=(X4-X2)/(X3-X1) \quad (7)$$

$$CPY=(Y4-Y2)/(Y3-Y1) \quad (8)$$

Figure 18:
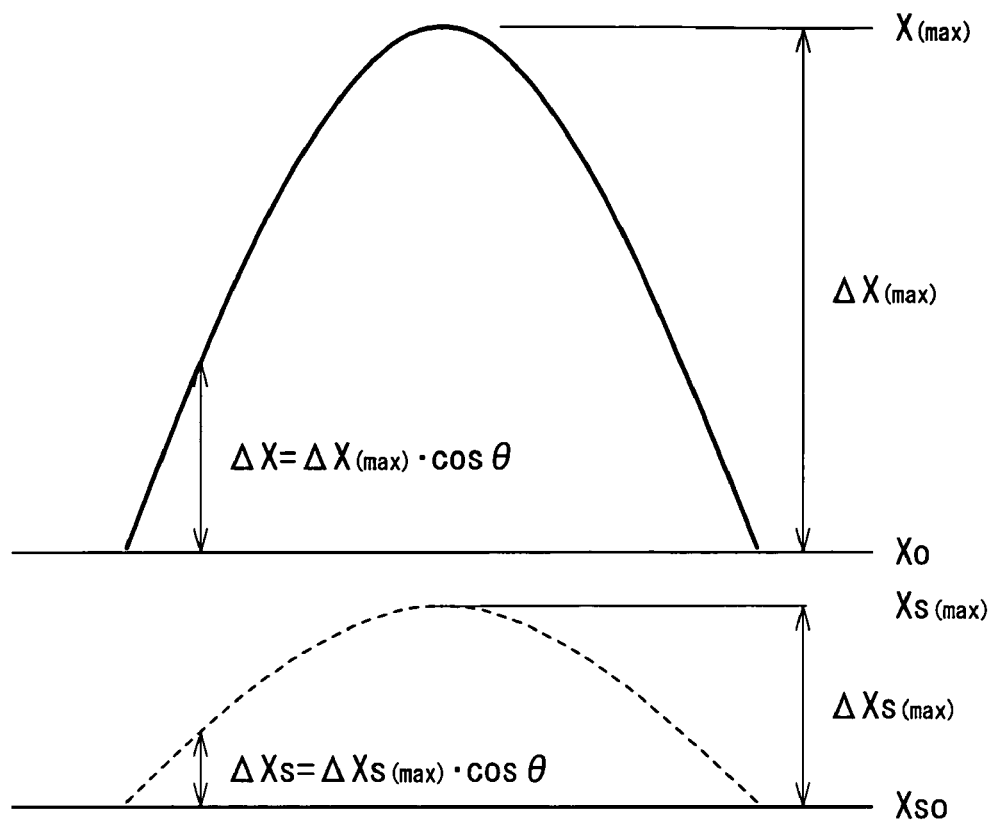
FIG. 18 is a conceptual diagram for explaining the relationship among output signals in the first MR element.

The significances of the differential data MOX and MOY and the compressed data CPX and CPY will be described below with reference to FIG. 18. FIG. 18 is a conceptual diagram for explaining the relationship among the respective output signals in the first MR element 1, on which the abscissa represents the angle θ and the ordinate represents the output level in the MR element 1.

In FIG. 18, reference Xo indicates an output level obtained with neither the bias magnetic field Hbx nor Hby applied (the state shown in FIG. 16A), where the direction in which the bias magnetic field Hby is generated is set to the north direction. This corresponds to the output signal X1. Since the direction of the magnetization J53 is orthogonal to the direction of the magnetization J51, the output level Xo corresponds to an intermediate point between the maximum value and the minimum value in the output level of the first MR element 1. Reference Xso indicates an output level obtained with the bias magnetic field Hby applied (the state shown in FIG. 16B). This corresponds to the output signal X2. Reference $X_{(max)}$ indicates an output level obtained with neither the bias magnetic field Hbx nor Hby applied (the state shown in FIG. 17A), where the direction in which the bias magnetic field Hby is generated is set to the east direction. This corresponds to the output signal X3. Reference $Xs_{(max)}$ indicates an output level obtained with the bias magnetic field Hby applied (the state shown in FIG. 17B). This corresponds to the output signal X4.

Consequently, as shown in the equation (5), the differential data MOX expressed by X1–X2 is a differential between the output level Xo and the output level Xso. A comparison of FIG. 16A with FIG. 16B indicates that both values are naturally equal to each other, and the differential should be zero. In fact, a certain differential is often generated due to manufacturing errors and the like. On the other hand, the compressed data CPX expressed by (X4–X2)/(X3–X1) is obtained by dividing a differential between the output level $Xs_{(max)}$ and the output level Xso by a differential between the output level $X_{(max)}$ and the output level Xo. By the presence of the bias magnetic field Hby, it is $Xs_{(max)} < X_{(max)}$, and the compressed data CPX is therefore naturally below 1.

Meanwhile, the differential data MOX and the compressed data CPX are determined by the structural state to be incorporated in the manufacturing stage. These are characteristic values inherent in the above magnetic direction sensor. After the manufacture thereof, these data are invariable in normal use and in the absence of mechanical and magnetic damages. For example, the compressed data CPX is stable at an arbitrary angle θ. This is true for the differential data MOY and the compressed data CPY. Accordingly, by accurately finding the differential data MOX and MOY and the compressed data CPX and CPY before observing the actual geomagnetism or the like, the accurate vector of the geomagnetism Ht, which is invariable due to the manufacturing errors etc., can be found from the above equations (2) to (4).

As described above, in the magnetic direction sensor and the method of detecting a magnetic direction using the magnetic direction sensor according to the present embodiment, the fixed data including the information of offset output due to the manufacturing errors are detected and stored in advance in the storage section, and the fixed data are used when measuring the direction of an arbitrary detected magnetic field. This simplifies the correction of the offset output, enabling high precision detection of a detected magnetic field direction in a predetermined direction.

While the present invention has been described by way of some embodiments and examples, the present invention is not limited to these, and various modifications may be made therein. For example, in the above embodiment, the first and second MR elements are arranged so that the directions in which a resistance value becomes an extreme are orthogonal to each other. Without limiting to this, the effect of the present invention is also obtainable when the directions in which the resistance value becomes the extreme are parallel to each other, or alternatively when an angle other than antiparallel is formed between the two directions. Although the direction of the magnetic direction sensor is set so that the bias magnetic field direction can be the north direction or the east direction, it may be set to an arbitrary direction. Although the bias magnetic field is applied to the respective magnetoresistive elements in the direction orthogonal to the magnetization direction of each pinned layer, without limiting to this, the bias magnetic field may be applied to the direction in which a certain relative angle is formed against the magnetization direction of each pinned layer.

It should be understood by those skilled in the art that various modifications, combinations, sub-combinations and alterations may occur depending on design requirements and other factors insofar as they are within the scope of the appended claims or the equivalents thereof.

What is claimed is:

1. A magnetic sensor comprising a measuring section, a storage section and an operating section, wherein the measuring section has a magnetoresistive element in which a pinned layer having a magnetization pinned in a certain direction and a free layer changing its magnetization direction depending on an external magnetic field are stacked with a non-magnetic intermediate layer in between, and a magnetic field applying means for applying, to the magnetoresistive element, a bias magnetic field in a direction forming a certain relative angle against the magnetization direction of the pinned layer, the measuring section detecting resistance values of the magnetoresistive element in accordance with a change of attitude direction of the magnetic sensor and presence or absence of the bias magnetic field, the storage section stores fixed data which is invariable irrespective of the attitude direction of the magnetic sensor, the fixed data configuring a part of the resistance values measured by the measuring section, and the operating section calculates a predetermined direction component of a magnetic field to be detected by using both of variable data which varies in accordance with the attitude direction of the magnetic sensor, and the fixed data stored in the storage section, the variable data configuring another part of the resistance values measured by the measuring section.

2. The magnetic sensor according to claim 1, wherein the fixed data contains:

differential data based on a differential between a resistance value of the magnetoresistive element with the bias magnetic field applied and a resistance value of the magnetoresistive element with the bias magnetic field unapplied, when the magnetic sensor changes its own attitude direction so that the direction of the bias magnetic field corresponds with a first direction; and compressed data based on a ratio between a displacement of a resistance value of the magnetoresistive element with the bias magnetic field applied and a displacement of a resistance value of the magnetoresistive element with the bias magnetic field unapplied, when the magnetic sensor changes its own attitude direction so that the direction of the bias magnetic field is shifted from the first direction to a second direction different from the first direction.

3. The magnetic sensor according to claim 2, wherein the operating section has a function of calculating the predetermined direction component of the magnetic field to be detected, based on the following equation (1)

$$Hv = (V - Vs - MOV)/(1 - CPV) \tag{1}$$

where,
- Hv is the predetermined direction component of the magnetic field to be detected;
- V is an output signal from the magnetoresistive element with the bias magnetic field unapplied, when the magnetic sensor is directed to an attitude direction;
- Vs is an output signal from the magnetoresistive element with the bias magnetic field applied, when the magnetic sensor is directed to the attitude direction;
- MOV is V1−V2;
- CPV is (V4−V2)/(V3−V1);
- V1 is a first output signal from the magnetoresistive element, detected with the bias magnetic field unapplied, when the magnetic sensor changes its own attitude direction so that the direction of the bias magnetic field corresponds with the first direction;
- V2 is a second output signal from the magnetoresistive element, detected with the bias magnetic field applied, when the magnetic sensor changes its own attitude direction so that the direction of the bias magnetic field corresponds with the first direction;
- V3 is a third output signal from the magnetoresistive element, detected with the bias magnetic field unapplied, when the magnetic sensor changes its own attitude direction so that the direction of the bias magnetic field corresponds with the second direction; and
- V4 is a fourth output signal from the magnetoresistive element, detected with the bias magnetic field applied, when the magnetic sensor changes its own attitude direction so that the direction of the bias magnetic field corresponds with the second direction.

4. A magnetic direction sensor comprising a measuring section, a storage section and an operating section, wherein
- the measuring section has first and second magnetoresistive elements and a magnetic field applying means,
- each of the first and second magnetoresistive elements has a stacked structure, in which a pinned layer having a magnetization pinned in a certain direction and a free layer changing its magnetization direction depending on an external magnetic field are stacked with a non-magnetic intermediate layer in between, and the first and second magnetoresistive elements are arranged to have different directions in which a resistance value becomes an extreme, and
- the magnetic field applying means applies, to the first and second magnetoresistive elements, first and second bias magnetic fields, respectively, the first bias magnetic field having a direction forming a certain relative angle against the magnetization direction of the pinned layer of the first magnetoresistive element, the second bias magnetic field having a direction forming a certain relative angle against the magnetization direction of the pinned layer of the second magnetoresistive element, and the measuring section detects resistance values of the first and second magnetoresistive elements in accordance with a change of attitude direction of the magnetic sensor and presence or absence of the first and second bias magnetic fields,
- the storage section stores fixed data which is invariable irrespective of the attitude direction of the magnetic sensor, the fixed data configuring a part of the resistance values measured by the measuring section, and
- the operating section calculates a magnetic field vector of a magnetic field to be detected by using variable data which varies in accordance with the attitude direction of the magnetic sensor, and the fixed data stored in the storage section, the variable data configuring another part of the resistance values measured by the measuring section.

5. The magnetic direction sensor according to claim 4, wherein the operating section has:
- a function of calculating a first component of the magnetic field to be detected in one direction, based on the following equation (2);
- a function of calculating a second component of the magnetic field to be detected in another direction, based on the following equation (3); and
- a function of calculating the magnetic field vector of the magnetic field to be detected by using the first component and the second component $$Hx=(X-Xs-MOX)/(1-CPX) \qquad (2)$$

$$Hy=(Y-Ys-MOY)/(1-CPY) \qquad (3)$$

where,
- Hx is a first component of the magnetic field to be detected;
- Hy is a second component of the magnetic field to be detected;
- X is an output signal from the first magnetoresistive element with the first bias magnetic field unapplied, when the magnetic sensor is directed to an attitude direction;
- Xs is an output signal from the first magnetoresistive element with the first bias magnetic field applied, when the magnetic sensor is directed to the attitude direction;
- Y is an output signal from the second magnetoresistive element with the second bias magnetic field unapplied, when the magnetic sensor is directed to the attitude direction;
- Ys is an output signal from the second magnetoresistive element with the second bias magnetic field applied, when the magnetic sensor is directed to the attitude direction;
- MOX is X1−X2;
- CPX is (X4−X2)/(X3−X1);
- X1 is a first output signal from the first magnetoresistive element, detected with the first and second bias magnetic fields unapplied, when the magnetic direction sensor changes its own attitude direction so that the direction of the first bias magnetic field corresponds with the first direction;
- X2 is a second output signal from the first magnetoresistive element, detected with the first bias magnetic field applied, when the magnetic direction sensor changes its own attitude direction so that the direction of the first bias magnetic field corresponds with the first direction;
- X3 is a third output signal from the first magnetoresistive element, detected with the first and second bias magnetic fields unapplied, when the magnetic direction sensor changes its own attitude direction so that the direction of the first bias magnetic field corresponds with a second direction different from the first direction;
- X4 is a fourth output signal from the first magnetoresistive element, detected with the first bias magnetic field applied, when the magnetic direction sensor changes its own attitude direction so that the direction of the first bias magnetic field corresponds with the second direction;
- MOY is Y1−Y2;
- CPY is (Y4−Y2)/(Y3−Y1);
- Y1 is a fifth output signal from the second magnetoresistive element, detected with the first and second bias magnetic fields unapplied, when the magnetic direction sensor changes its own attitude so that the direction of the second bias magnetic field corresponds with the first direction;

Y2 is a sixth output signal from the second magnetoresistive element, detected with the second bias magnetic field applied, when the magnetic direction sensor changes its own attitude direction so that the direction of the second bias magnetic field corresponds with the first direction;

Y3 is a seventh output signal from the second magnetoresistive element, detected with the first and second bias magnetic fields unapplied, when the magnetic direction sensor changes its own attitude direction so that the direction of the second bias magnetic field corresponds with the second direction; and Y4 is an eighth output signal from the second magnetoresistive element, detected with the second bias magnetic field applied, when the magnetic direction sensor changes its own attitude direction so that the direction of the second bias magnetic field corresponds with the second direction.

6. A method of detecting a magnetic field using a magnetic sensor comprising a magnetoresistive element in which a pinned layer having a magnetization pinned in a certain direction and a free layer changing its magnetization direction depending on an external magnetic field are stacked with a non-magnetic intermediate layer in between, and a magnetic field applying means for applying, to the magnetoresistive element, a bias magnetic field in a direction forming a certain relative angle against the magnetization direction of the pinned layer, the method comprising:

a first step of setting an attitude direction of the magnetic sensor so that a direction of the bias magnetic field corresponds with a first direction, and detecting a first output signal from the magnetoresistive element with the bias magnetic field unapplied, and also detecting a second output signal from the magnetoresistive element with the bias magnetic field applied;

a second step of setting an attitude direction of the magnetic sensor so that a direction of the bias magnetic field corresponds with a second direction different from the first direction, and detecting a third output signal from the magnetoresistive element with the bias magnetic field unapplied, and also detecting a fourth output signal from the magnetoresistive element with the bias magnetic field applied; and a third step of calculating a component of a magnetic field to be detected, the component in a direction where a resistance value of the magnetoresistive element becomes an extreme, based on the following equation (1)

$$Hv=(V-Vs-MOV)/(1-CPV) \qquad (1)$$

where,

Hv is the component of the magnetic field to be detected, the component in the direction where the resistance value of the magnetoresistive element becomes an extreme;

V is an output signal from the magnetoresistive element with the bias magnetic field unapplied, when the magnetic sensor is directed to an attitude direction;

Vs is an output signal from the magnetoresistive element with the bias magnetic field applied, when the magnetic sensor is directed to the attitude direction;

MOV is V1−V2;

CPV is (V4−V2)/(V3−V1);

V1 is the first output signal;

V2 is the second output signal;

V3 is the third output signal; and

V4 is the fourth output signal.

7. The method of detecting a magnetic field according to claim 6, using the magnetic sensor configured so that a direction where a resistance value of the magnetoresistive element becomes an extreme is orthogonal to a direction of the bias magnetic field.

8. The method of detecting a magnetic field according to claim 6, wherein in each of the first and second steps, a resistance value of the magnetoresistive element is measured repeatedly, and based on average values thereof, the first to fourth output signals are determined, respectively.

9. The method of detecting a magnetic field according to claim 6, wherein the first direction is south or north.

10. A method of detecting a magnetic direction using a magnetic direction sensor provided with (i) first and second magnetoresistive elements each having a stacked structure in which a pinned layer having a magnetization pinned in a certain direction and a free layer changing its magnetization direction depending on an external magnetic field are stacked with a non-magnetic intermediate layer in between, the first and second magnetoresistive elements being arranged to have different directions in which a resistance value becomes an extreme, and (ii) a magnetic field applying means for applying, to the first and second magnetoresistive elements, first and second bias magnetic fields, respectively, the first bias magnetic field having a direction forming a certain relative angle against the magnetization direction of the pinned layer of the first magnetoresistive element, the second bias magnetic field having a direction forming a certain relative angle against the magnetization direction of the pinned layer of the second magnetoresistive element, the method comprising:

a first step of setting an attitude direction of the magnetic direction sensor so that a direction of the first bias magnetic field corresponds with a first direction, and detecting a first output signal from the first magnetoresistive element with the first and second bias magnetic fields unapplied, and also detecting a second output signal from the first magnetoresistive element with the first bias magnetic field applied;

a second step of setting an attitude direction of the magnetic direction sensor so that a direction of the first bias magnetic field corresponds with a second direction different from the first direction, detecting a third output signal from the first magnetoresistive element with the first and second bias magnetic fields unapplied, and also detecting a fourth output signal from the first magnetoresistive element with the first bias magnetic field applied;

a third step of setting an attitude direction of the magnetic direction sensor so that a direction of the second bias magnetic field corresponds with the first direction, and detecting a fifth output signal from the second magnetoresistive element with the first and second bias magnetic fields unapplied, and also detecting a sixth output signal from the second magnetoresistive element with the second bias magnetic field applied;

a fourth step of setting an attitude direction of the magnetic direction sensor so that a direction of the second bias magnetic field corresponds with the second direction, and detecting a seventh output signal from the second magnetoresistive element with the first and second bias magnetic fields unapplied, and also detecting an eighth signal from the second magnetoresistive element with the second bias magnetic field applied;

a fifth step of calculating a first component of a magnetic field to be detected, the first component in a direction where a resistance value of the first magnetoresistive element becomes an extreme, based on the following equation (2); and a sixth step of calculating a second component of the magnetic field to be detected, the second component in a direction where a resistance value of the second magnetoresistive element becomes an extreme, based on the following equation (3);

a seventh step of calculating a magnetic field vector of the magnetic field to be detected by using the first component and the second component $$Hx=(X-Xs-MOX)/(1-CPX) \quad (2)$$

$$Hy=(Y-Ys-MOY)/(1-CPY) \quad (3)$$

where,

Hx is the first component of the magnetic field to be detected;

Hy is the second component of the magnetic field to be detected;

X is an output signal from the first magnetoresistive element with the first bias magnetic field unapplied, when the magnetic direction sensor is directed to an attitude direction;

Xs is an output signal from the first magnetoresistive element with the first bias magnetic field applied, when the magnetic direction sensor is directed to the attitude direction;

Y is an output signal from the second magnetoresistive element with the second bias magnetic field unapplied, when the magnetic direction sensor is directed to the attitude direction;

Ys is an output signal from the second magnetoresistive element with the second bias magnetic field applied, when the magnetic direction sensor is directed to the attitude direction;

MOX is X1−X2;

CPX is (X4−X2)/(X3−X1);

X1 is the first output signal;

X2 is the second output signal;

X3 is the third output signal;

X4 is the fourth output signal;

MOY is Y1−Y2;

CPY is (Y4−Y2)/(Y3−Y1);

Y1 is the fifth output signal;

Y2 is the sixth output signal;

Y3 is the seventh output signal; and

Y4 is the eighth output signal.

11. The method of detecting a magnetic direction according to claim 10, using the magnetic direction sensor configured so that a direction where a resistance value of the first magnetoresistive element becomes an extreme is orthogonal to a direction of the first bias magnetic field, and a direction where a resistance value of the second magnetoresistive element becomes an extreme is orthogonal to a direction of the second bias magnetic field.

12. The method of detecting a magnetic direction according to claim 10, wherein in the seventh step, magnitude Hm of a magnetic field vector of the magnetic field to be detected is determined based on the following equation (4)

$$Hm=\{(Hx)^2+(Hy)^2\}^{0.5} \quad (4).$$

13. The method of detecting a magnetic direction according to claim 10, wherein in the first to fourth steps, resistance values of the first and second magnetoresistive elements are measured repeatedly, and based on average values thereof, the first to eighth output signals are determined, respectively.

14. The method of detecting a magnetic direction according to claim 10, wherein the first direction is south or north.

* * * * *